(12) United States Patent
Pilling

(10) Patent No.: US 7,594,149 B2
(45) Date of Patent: *Sep. 22, 2009

(54) IN-SITU MONITOR OF PROCESS AND DEVICE PARAMETERS IN INTEGRATED CIRCUITS

(75) Inventor: David J. Pilling, Los Altos Hills, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 118 days.

This patent is subject to a terminal disclaimer.

(21) Appl. No.: 11/142,758

(22) Filed: May 31, 2005

(65) Prior Publication Data

US 2006/0190785 A1  Aug. 24, 2006

Related U.S. Application Data

(63) Continuation-in-part of application No. 11/064,038, filed on Feb. 22, 2005, now Pat. No. 7,583,087.

(51) Int. Cl.
*G01R 31/28* (2006.01)
*G01R 31/08* (2006.01)

(52) U.S. Cl. ........................... 714/726; 324/522
(58) Field of Classification Search ................ None
See application file for complete search history.

(56) References Cited

U.S. PATENT DOCUMENTS

| | | | |
|---|---|---|---|
| 4,710,927 A | 12/1987 | Miller | |
| 4,980,639 A * | 12/1990 | Yoshizawa et al. | 324/751 |
| 5,099,481 A | 3/1992 | Miller | |
| 5,198,758 A * | 3/1993 | Iknaian et al. | 714/724 |
| 5,331,645 A | 7/1994 | Miller et al. | |
| 5,359,234 A | 10/1994 | Atriss et al. | |
| 5,554,941 A * | 9/1996 | Kesel | 324/765 |
| 5,581,564 A | 12/1996 | Miller et al. | |
| 5,606,275 A * | 2/1997 | Farhang et al. | 327/108 |
| 5,734,661 A * | 3/1998 | Roberts et al. | 714/733 |

(Continued)

FOREIGN PATENT DOCUMENTS

EP  0254981  2/1988

(Continued)

OTHER PUBLICATIONS

IEEE Computer Society, "1149.1: IEEE Standard Test Accesss Port and Boundary-Scan Architecture," 2001.

(Continued)

*Primary Examiner*—Christine T Tu
(74) *Attorney, Agent, or Firm*—Finnegan, et al.

(57) ABSTRACT

In accordance with the invention, a testing circuit formed on the integrated circuit is presented. A testing circuit according to the present invention is coupled to a scan path circuit and includes an input circuit coupled to a parameter testing circuit and an output driver coupled to the parameter testing circuit. Embodiments of the parameter testing circuit can include circuits for testing process, device, and circuit characteristics of the integrated circuit. Further, some embodiments of the testing circuit can be included in a scan path system where sequences of various testing circuits are included. Further, test parameters obtained from the parameter testing circuits can be utilized to adjust operating parameters of the integrated circuit.

19 Claims, 23 Drawing Sheets

U.S. PATENT DOCUMENTS

| | | | |
|---|---|---|---|
| 5,903,012 A | 5/1999 | Boerstler | |
| 6,064,230 A | 5/2000 | Singh | |
| 6,429,677 B1 | 8/2002 | Montrose | |
| 6,476,630 B1* | 11/2002 | Whitten et al. | 324/765 |
| 6,515,486 B1* | 2/2003 | Nguyen | 324/615 |
| 6,556,938 B1 | 4/2003 | Rohrbaugh et al. | |
| 6,681,193 B2 | 1/2004 | Dallavalle | |
| 6,894,308 B2* | 5/2005 | Whetsel et al. | 257/48 |
| 7,109,734 B2* | 9/2006 | Yuan et al. | 324/763 |
| 7,145,356 B2* | 12/2006 | Sang Gi | 324/769 |
| 2002/0116674 A1* | 8/2002 | Schmid | 714/724 |
| 2003/0126533 A1* | 7/2003 | McAdams | 714/727 |
| 2003/0193051 A1 | 10/2003 | Beech | |
| 2005/0188289 A1* | 8/2005 | Berndlmaier et al. | 714/733 |
| 2006/0190785 A1 | 8/2006 | Pilling | |
| 2006/0190790 A1* | 8/2006 | Pilling et al. | 714/734 |
| 2006/0267621 A1* | 11/2006 | Harris et al. | 324/765 |

FOREIGN PATENT DOCUMENTS

EP     1367403 A2     12/2003

OTHER PUBLICATIONS

IEEE Computer Society, "1149.6: IEEE Standard for Boundary-Scan Testing of Advanced Digital Networks," Apr. 17, 2003.

Amendment and Response to Office Action filed Aug. 27, 2007, in related U.S. Appl. No. 11/142,758.

Final Office Action mailed Nov. 28, 2007, In related U.S. Appl. No. 11/142,758.

Amendment and Response to Office Action filed Feb. 28, 2008, In related U.S. Appl. No. 11/142,758.

Office Action mailed Apr. 23, 2008, in related U.S. Appl. No. 11/142,758.

Amendment and Response to Office Action filed Jul. 23, 2008, in related U.S. Appl. No. 11/142,758.

Final Office Action dated Oct. 27, 2008, In related U.S. Appl. No. 11/142,758.

* cited by examiner

IN-SITU MONITOR OF PROCESS AND DEVICE PARAMETERS IN INTEGRATED CIRCUITS

RELATED APPLICATION

This disclosure is a continuation-in-part of U.S. Pat. No. 11/064,038, filed Feb. 22, 2005 (now pending), which is herein incorporated by reference in its entirety.

FIELD OF THE INVENTION

The present invention is related to in-situ monitoring of semiconductor circuits and, in particular, to in-situ monitoring of process and device parameters in integrated circuits.

BACKGROUND OF THE INVENTION

Technology is trending toward the development of smaller and higher performance integrated circuits. The assessment of device parameters from test wafers that accompany batches of wafers in processing can be wholly misleading as to the geometries that actually exist on individual integrated circuits and even on the individual wafers that contain the integrated circuits. Tests that are conventionally performed on test wafers can include, for example, process, continuity, and design rule checks as well as device charateristic tests (e.g., device leakage tests), gate oxide leakage current tests, or circuit characteristic tests. In particular, test structures formed on test wafers are not always equivalent to the structures utilized in the integrated circuits. Test wafers are often produced with abbreviated process conditions and often lack the critical dimensions utilized in the integrated circuits on wafers that are supposedly being tested.

Access to test wafer information can be expensive in both labor and material cost. Further, test wafer information is not specific to the wafer that includes integrated circuits as processed or the die subjected to packaging. Device parameters can undergo subtle changes during further processing such as reliability stress conditions such as "burn-in" or packaging. The test wafer does not typically undergo "burn-in" and is not subjected to the stresses of further processing. Often the changes in device parameters as a result of further processing are explained with second order parameters such as impedance or delay changes. No direct method of determining some of these parameters on a specific die is generally available.

Gate oxide leakage is one such parameter. Gate oxide leakage has become an important process and design parameter as integrated circuits scale to smaller dimensions. Gate oxide leakage for older manufacturing technologies with about a 60 Å thick oxide were below about $1 \times 10^{-15}$ amperes per square micron with 3.3 V bias across the oxide. Current manufacturing technologies with 16 Å of gate oxide, however, have shown measured leakages of about $4 \times 10^{-8}$ amperes per square micron with a bias voltage of about one volt. From a different perspective, it has been reported that leakage from a 0.13 micron technology constitutes about 15% of core power in contrast to over 50% of the core power for a 0.09 micron technology in designs in excess of two million transistors.

The increase in device leakage with die sizing remaining the same adds to the increase in chip power consumption and design restrictions for scaled processes. Previously, chip power consumption consisted primarily of the charging and discharging of internally and externally connected capacitance. In aggregate, the junction leakage component was small enough to be neglected compared to the dynamic or AC power dissipation in older designs.

Typical process monitors for gate oxide leakage consist of a gate oxide grown over a large area on an otherwise, unprocessed wafer. Measureable leakage currents on a large area capacitor can be obtained using a shielded low current ammeter, which would otherwise be unobtainable from a single transistor. The leakage current process monitors, for reasons of economy, are not processed with the full compliment of processing steps, (e.g., implants or top metal layers). The leakage currents measured with process monitors may be conservative in that strain effects are not present. The leakage value may be excessive, representing single defects in the large area capacitor of the die independent of the test monitor.

There is a large variation in leakage currents from wafer to wafer and from batch to batch as a result of variations in defect levels and process conditions. Variations may occur at different locations on single wafers. Therefore, utilizing a whole wafer to provide leakage current and extrapolating that data over each integrated circuit in a batch of wafers is often unreliable and misleading.

Product reliability is often associated with single defect failures. Current products processed with thin gate oxides have witnessed increases in power consumption, thus increasing the temperature of the chip and thereby degrading speed performance. Identification of the source of the power increase is essential for reliability analysis. A method of improving the reliability of components is to subject them to stress testing or "burn-in." "Burn-in" consists of applying a maximum voltage across the oxide or junction at an elevated temperature. Increases in leakage currents after "burn-in" have been measured on weak or defective components.

Some present methods of measuring gate oxide leakage usually involves probing wafers with large area MOS test devices. These MOS devices are not necessarily representative of gate structures actually found on integrated circuits. The large-area MOS test structures are not on the same wafer processed with the integrated circuits. Consequently, values of leakage currents obtained by these test structures are not necessarily representative of the actual leakage current exhibited by devices produced by the technology.

The reliability of devices suffers as a result of thin gate oxides. Reliability testing, or "burn-in," is expensive both in labor and equipment costs. "Burn-in" includes stressing the integrated circuit with maximum voltage at high temperatures for short periods of time. Failures may occur from other than increases in gate oxide leakage, in which case it can be difficult to identify failure modes.

Therefore, there is a need for better device parameter measurements. Additionally, there is a need for device parameter measurements that can test parameters associated with an integrated circuit before and after processes such as "burn-in" or chip packaging.

SUMMARY

In accordance with the invention, process, device, and circuit parameter testing is performed on an integrated circuit. In some embodiments, parameter testing can be performed within a boundary scan architecture. Such testing can provide critical parameter information utilizing additions to the standard cell libraries of specific test circuits. In such fashion, most readily and economically feasible process, device, and circuit parameter testing can be performed.

An integrated circuit according to the present invention, therefore, includes a test circuit embedded within the integrated circuit, the test circuit capable of providing data regarding at least one process, device, or circuit parameter; an input register that provides an input signal to the test circuit; and an output register that receives test data from the test circuit.

A method of testing and monitoring an integrated circuit according to the present invention, then, includes placing the integrated circuit in a test controller; writing data to an input register in a scan path circuit with a test circuit; and reading data from an output register of the scan path circuit, the output register being coupled to the test circuit.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed. These and other embodiments are further discussed below with reference to the accompanying drawings, which are incorporated in and constitute a part of this specification.

Figure 1A:
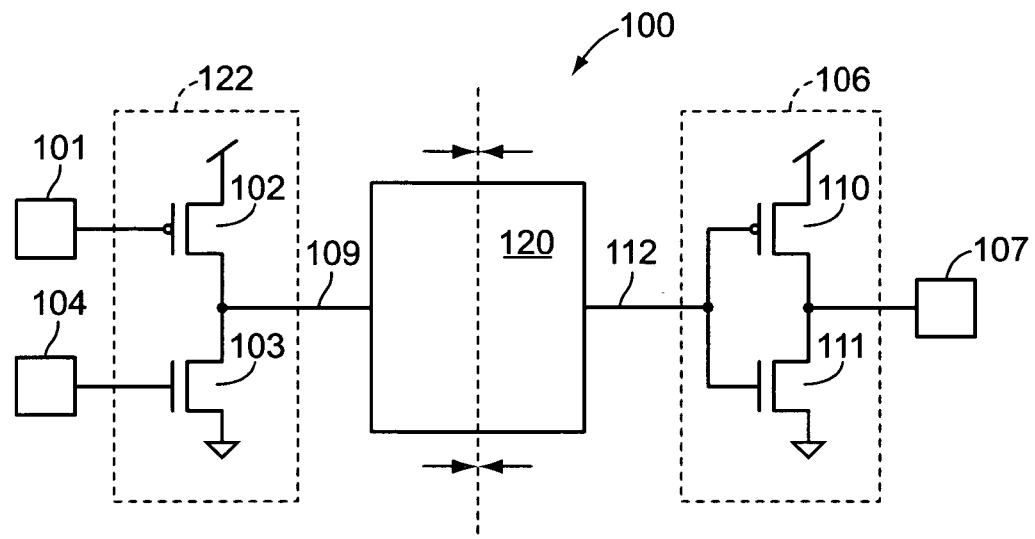
FIGS. 1A and 1B illustrate an embodiment of an embedded testing circuit according to some embodiments of the present invention.

In the figures, elements having the same designation have the same or similar function.

DETAILED DESCRIPTION

In accordance with embodiments of the present invention, circuits to measure process, design, and circuit parameters can be accessible at all stages of development and use of the integrated circuit chip in which they are embedded. Embodiments of the invention can range from a method of obtaining gate leakage data with a custom designed circuit, which may require special access pads, to a circuit for obtaining a full range of all process, device and circuit parameters incorporated in an existing scan path test system (JTAG) present in the integrated circuit. Therefore, in accordance with some embodiments of the present invention, scan path technology can be expanded from pin continuity testing and internal chip logic testing to process, device, and circuit parameter testing and monitoring.

Some embodiments of the invention can utilize additional bonding pads and separate testing resources, which may also require additional layout resources. However, some embodiments of the invention can benefit from the standard cell and scan path technology currently in place on many integrated circuit technologies.

The current trend of the IC industry is to remove the chip design from fabrication facilities and to perform device characterization to test whether device production are simply within specified process and device limits by testing on test dies. Thus product characterization is often done without the range of process and device "corners". In addition, parameters specific to individual die cannot be easily obtained. Such information regarding each individual die can be important for packaged die, stress testing, and monitoring of customer returns. Further, state-of-the-art process technology is often undergoing development, especially in the 90 nanometer gate and below ranges. It is critical, that the design, product, and reliability engineering not only have an ability to monitor these parameters, but have recourse to Boundaries to test the impact of process changes on IC performance.

In accordance with aspects of the present invention, any number of device parameter monitors can be incorporated onto an integrated circuit. Some examples of such parameter monitors and tests include resistivity and continuity tests, leakage current tests, saturation current tests, dielectric integrity tests, device monitors, and circuit monitors. Examples of resistivity and continuity tests include n+ diffusion, p+ diffusion, n-well, metal layers, n+ contacts, p+ contacts, and metal-to-metal vias. Examples of leakage current parameter tests include gate oxides, source-drain, well-substrate, p+ diffusion to n-well, n+ diffusion to p substrate, n+ diffusion to n+ diffusion in p substrate, p+ diffusion to p+ diffusion in n-well, p+ diffusion to n substrate, n+ diffusion to p-well, n+ diffusion to n+ diffusion in p-well, and p+ diffusion to p+ diffusion in n substrate test. Examples of dielectric integrity parameters include adjacent interconnect metal-to-metal leakage and interconnect metal covering interconnect metal leakage parameters. Examples of device monitor parameters include n channel thresholds, p channel thresholds, n channel currents in saturation, p channel currents in saturation, n channel current in the linear operation region, and p channel current in the linear operating region tests. Examples of circuit monitors include delay chain tests. The least expensive design method of introducing these tests is by way of designing test circuit cells to be compatible with a standard cell library so as to introduce the test circuit into the integrated circuit with standard cell place-and-route software.

Figure 1B:
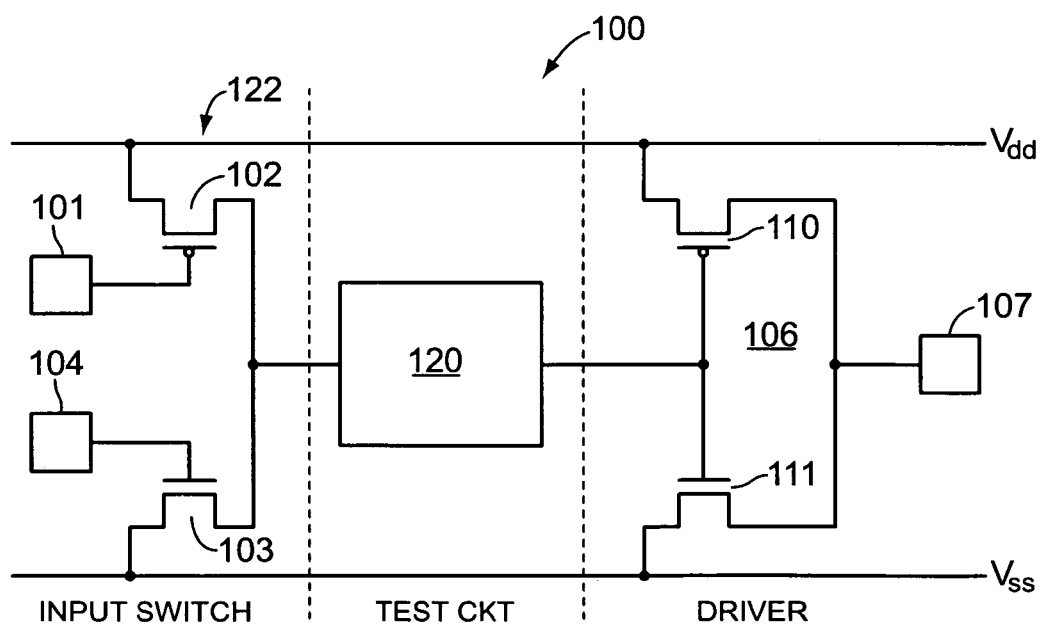

FIGS. 1A and 1B illustrate a cell design and circuit 100 for testing and monitoring critical semiconductor process, device, and circuit parameters according to some embodiments of the present invention. FIG. 1A illustrates a circuit diagram and FIG. 1B shows a transistor STIK representation of a standard cell of the circuit shown in FIG. 1A. Monitoring and testing of semiconductor process, device, and circuit parameters can be accomplished at wafer sort time utilizing test structures according to some embodiments of the present invention. Further, such test structures allow access to monitor parameters after packaging. Therefore, testing after reliability stress (e.g., burn-in) as well as testing of returned units (e.g., customer returns) can be accomplished.

As shown in FIGS. 1A and 1B, circuit 100 can include an input buffer 122, a test circuit 120 coupled to input buffer 122, and an output driver 106 coupled to test circuit 120. Input buffer 122 can include series coupled transistors 102 and 103 with a source/drain of transistor 102 coupled to power and a source/drain of transistor 103 coupled to ground. The gate of transistor 102 is coupled to a terminal 101 so that a low voltage applied to terminal 101 turns transistor 102 "on." The gate of transistor 103 is coupled to terminal 104 such that a voltage applied to terminal 104 turns transistor 103 "on." Therefore, node 109 between transistors 102 and 103 can be set to Vdd or ground by signals input to terminals 101 and 104.

Node 109 is coupled to parameter test circuit 120. Parameter test circuit 120, in response to signals received at node 109, provides an output signal to output driver 106 that is related to a monitored parameter. In some embodiments, output driver 106 can include a conventional CMOS inverter, as shown in FIG. 1A. Output driver 106, then, includes series coupled transistors 110 and 111, with node 112 coupled to the gates of p-MOS transistor 110 and n-MOS transistor 111. Output terminal 107 is then coupled to a node between transistors 110 and 111. However, output driver 106 may be any input device, including, as examples, a CMOS inverter, a follower, or an analog-to-digital converter.

In some embodiments, transistors 110, 111, 102, and 103 can be formed from thick gate oxides in order to substantially eliminate effects from leakage through transistors 110 and 111 and reduce the contribution of capacitance to node 112. Further, in some embodiments, a parameter test circuit 120 can be formed by modifying a standard non-inverting buffer cell in order to measure a parameter.

In some embodiments of the invention, circuit 100 can be tested by applying signals to terminals 101 and 104 and monitoring the output signal at terminal 107. For example, in some embodiments when transistor 102 is on and transistor 103 is off, then the output signal at terminal 107 should be low. Alternatively, when transistor 103 is on and transistor 102 is off, the output signal at terminal 107 should be high. This testing feature is an important advantage in scan path testing.

Test circuit 120 can be inserted internal to buffer 122 if buffer 122 is cleaved into two sections. In some embodiments, static parameters (e.g., leakage currents and resistances) can be measured utilizing timing measurements within a scan path technology. Scan path technology is further described in the "IEEE Standard Test Access Port and Boundary-Scan Architecture", IEEE Standard 1149 (2001), which is herein incorporated by reference in its entirety, and "IEEE Standard for Boundary-Scan Testing of Advanced Digital Networks," IEEE 1149.6 (2003), which is herein incorporated by reference in its entirety.

The scan path technology described in standards 1149 and 1149.6 can utilize the clock generated from the automatic test system incorporated with external programs for counting and loading serial data streams for instructions and data to access test cells such as that shown in FIGS. 1A and 1B. The cells shown in FIGS. 1A and 1B can be embedded in the scan path test system on the chip. An ordered sequence of tests can then be performed in the scan path system to facilitate monitoring of a broad range of parameters.

In some embodiments, some tests may be dependent on parameters measured in previous tests. Such a dependence can improve the accuracy of subsequent tests Parameter accuracy, then, can be obtained by ordered sequences of tests. An example of such an ordered sequence of tests is as follows: 1) Source-drain current of n-channel transistor in saturation; 2) Source-drain current of p-channel transistor in saturation; 3) Resistance of n+ diffusion resistor; 4) Resistance of p+ diffusion resistor; 5) Resistance of n-well resistor; 6) Resistance of n+ poly resistor; 7) Resistance of p+ poly resistor; 8) Leakage current of thin oxide gate; 9) Source-drain leakage current of p-channel transistor gated off; 10) Source-drain leakage current of n-channel transistor gated off; 11) Leakage current of thin gate oxide of p-channel transistor; 12) Leakage current of thin gate oxide of n-channel transistor; 13) Leakage current of back-biased nwell to substrate diode; 14) Capacitance of p-channel thin gate oxide; 15) Capacitance of n-channel thin gate oxide; 16) P-Channel transistor threshold voltages; 17) N-channel transistor threshold voltage; and 18) N number of delays (1 to n) of selected delay paths. One skilled in the art will recognize that other sequences of tests can be implemented.

Figure 2A:
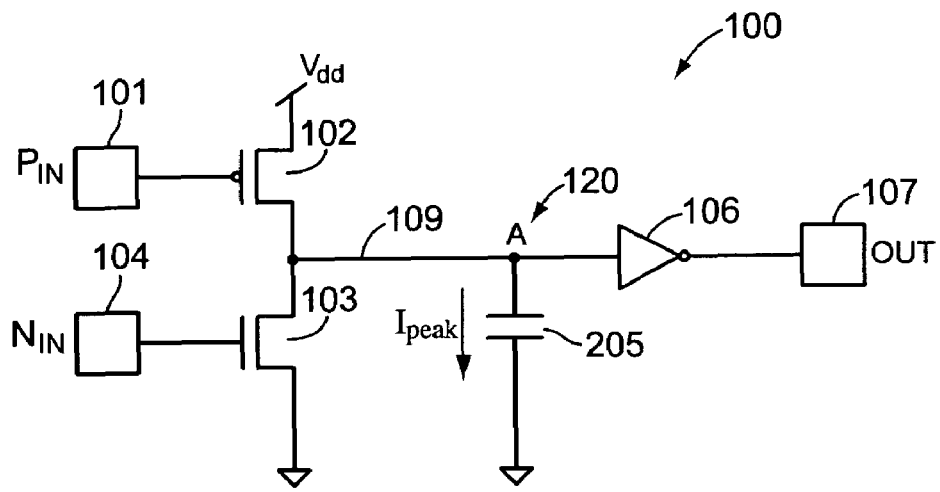
FIGS. 2A and 2B illustrate an embodiment of a leakage current circuit according to the present invention.

FIG. 2A illustrates an embodiment of a leakage current test circuit that can be utilized in the present invention. The embodiment of parameter test circuit 120 shown in FIG. 2A is a capacitor 205. Node 109 is coupled to ground through capacitor 205. Capacitor 205 can represent the capacitance across a thin gate oxide, for example, so that the leakage current through the thin gate oxide can be measured by determining the leakage current across capacitor 205. Node 109 is further coupled to inverter 106. The output signal from inverter 106 is low if node 109 is high and becomes high when the voltage at node 109 drops below a threshold voltage. The output signal from inverter 106 can be read at terminal 107.

Figure 2B:
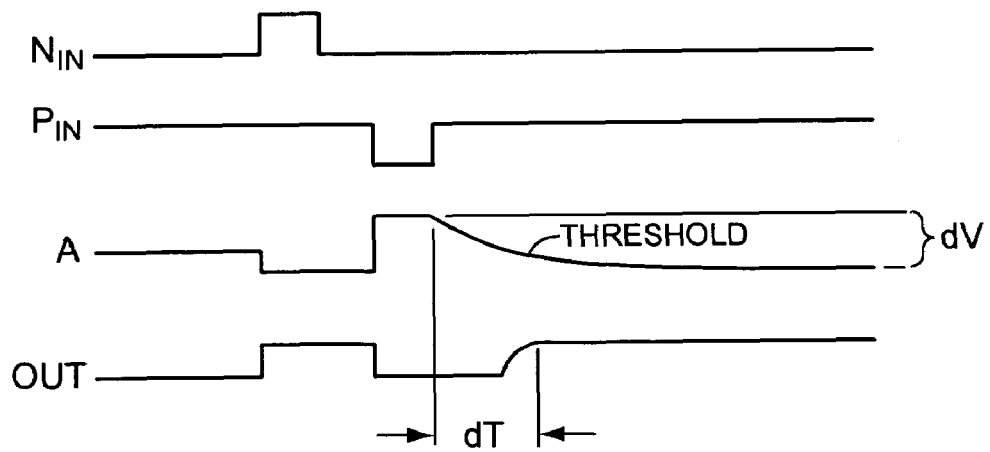

FIG. 2B illustrates the voltage signals Pin at terminal 101, Nin at terminal 104, and OUT at terminal 107 as well as signal A at node 109 during a measurement of the gate oxide leakage current at capacitor 205. Node 109 is first discharged to ground by applying a voltage pulse to terminal 104 that turns transistor 103 "on." Subsequently, a voltage pulse is applied to terminal 101 that turns transistor 102 "on" while transistor 103 is "off," charging capacitor 205 so that node 109 is substantially Vdd. Transistor 102 is then turned "off" allowing node 109 to float against the slow discharge of the leakage current through capacitor 205. Once the voltage at node 109 drops below a threshold voltage, as shown in FIG. 2B, the output signal from inverting amplifier 106 switches from "low" to "high." The time between shutting off transistor 102 and the transition from "low" to "high" in the output signal of amplifier 106 can then be monitored and utilized as a basis for calculating the leakage current through capacitor 106.

The leakage current associated with node 109 is given by $$I(\text{leakage}) = C(\Delta V/\Delta T)$$

where C is the calculated gate capacitance value of node 109, $\Delta V$ is the difference between the supply voltage Vdd and the switching point threshold of inverter 106, and $\Delta T$ is the time measured from the time that transistor 102 is turned off and the time that the output signal from inverter 106 goes "high."

A similar sequence can be utilized to determine the leakage current of a capacitor referenced to ground rather than to Vdd. In that configuration, capacitor 205 is coupled between node 109 and Vdd instead of between node 109 and ground as shown in FIG. 2A. The test timing for leakage current circuit 100 with such a configuration of capacitor 205 is reversed so that the voltage at node 109 increases from ground rather than decreases from Vdd in order to determine the characteristic decay time $\Delta T$.

Any capacitor structure can be utilized for capacitor 205. In some embodiments, a monitoring system includes several circuits 100, each with a different parameter test circuit 120, in order to test various aspects of parameters such as the leakage current through the gate oxide.

Figure 2C:
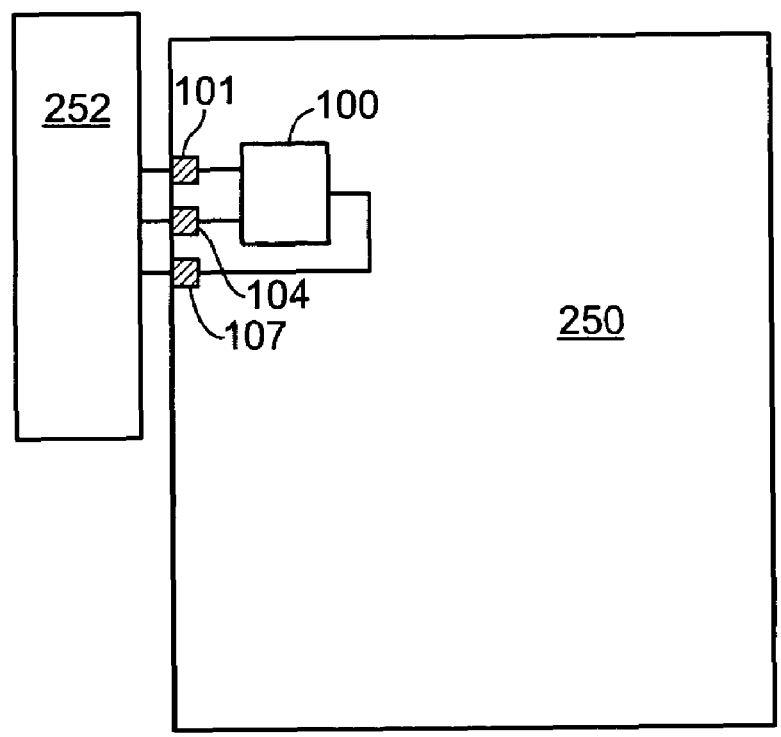
FIG. 2C illustrates implementation of a leakage current circuit on an integrated circuit according to the present invention.

FIG. 2C illustrates utilization of some embodiments of the invention to monitor or measure certain parameters on an individual integrated circuit 250. In the embodiment shown in FIG. 2C, terminals 101, 104, and 107 are coupled to external pins directly and therefore circuit 100 is directly accessible to an outside testing circuit 252. In some embodiments of the invention, circuit 100 is accessible through, for example, registers in a flow-scan circuit. These embodiments are discussed in further detail below.

Integrated circuit 250 can be any circuit and can have any number of transistors. Although some embodiments of the invention do not increase the number of pads utilized on circuit 250 to implement circuit 100, the embodiment shown in FIG. 2C utilizes terminals 101, 104, and 107 as input and output pads on integrated circuit 250. Integrated circuit 250 can be coupled through terminals 101, 104, and 107 to testing circuit 252. Testing circuit 252 then applies voltages to terminals 101 and 104 and reads results from terminal 107 as described above with respect to FIGS. 1A through 2B.

In some embodiments of the invention, circuit 100 can be coupled to pads that are utilized for other purposes as well. Further, circuit 100 can be implemented in a boundary scan architecture with various other testing circuits and therefore no pads are required to implement circuit 100 except for the boundary scan pads. In some embodiments, more than one of circuit 100 with different configurations for parameter testing circuit 120 can provide signals from which parameters related to processing, devices, or circuitry can be obtained.

Figure 2D:
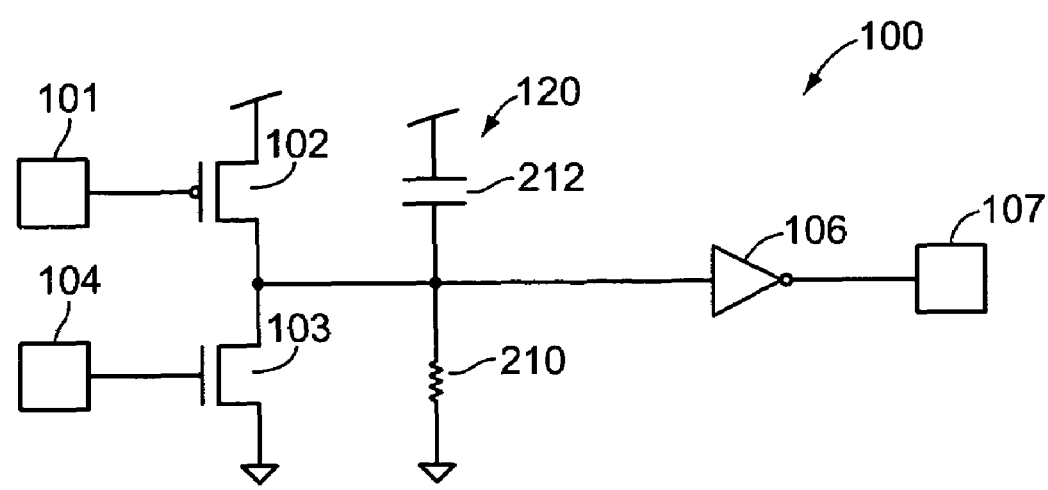
FIG. 2D illustrates an embodiment of a resistance and continuity test according to some embodiments of the present invention.

FIG. 2D illustrates an example of a resistivity and continuity test. As shown in FIG. 2D, testing circuit 120 includes a resistive element 210 coupled with a capacitor 212 where capacitor 212 is a capacitor with known characteristics. In some embodiments, capacitor 212 may be formed with a thick gate oxide with negligible leakage characteristics. The resistance of resistor 210, which can be a connection, diffusion layer, or via, can then be determined from the decay time of capacitor 212. In this fashion, p+ or n+ well diffusion parameters for devices on the integrated circuit can be determined. Further, the embodiment of circuit 100 shown in FIG. 2D can be coupled such that resistor 212 is a n+ or p+ diffusion contact or metal-to-metal interconnect vias in order to monitor the resistive parameters of these contacts and vias.

FIGS. 3A through 3D illustrate some examples of capacitor structures that can be utilized as capacitor 205 in a parameter testing circuit 120 shown in FIG. 2A in order to provide various ones of the leakage current test parameters described above. Although not all of the examples illustrated above for leakage current test parameters are specifically illustrated in FIGS. 3A through 3D, it is expected that one skilled in the art can easily determine the appropriate test circuit for any leakage current parameter from this disclosure of specific examples of leakage current test circuits. Testing circuits for the examples of leakage current parameters listed above, or any other parameter, is therefore considered to be within the spirit and scope of this disclosure.

Figure 3A:
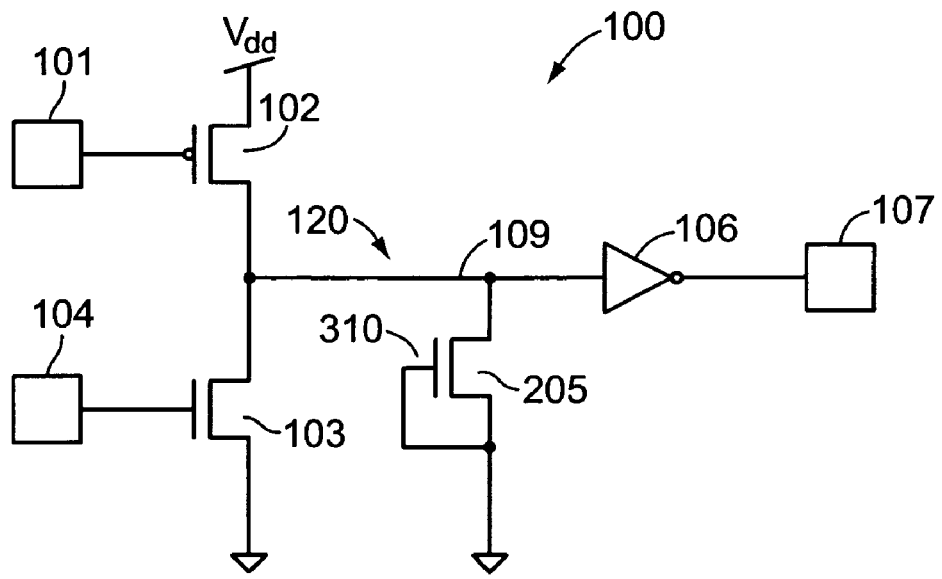
FIGS. 3A, 3B, 3C, and 3D illustrate various configurations of capacitors that can be utilized in a leakage current circuit according to embodiments of the present invention.

In FIG. 3A, capacitor 205 includes a transistor 310 where one source/drain of transistor 310 is coupled to node 109 and the opposite source/drain of transistor 110 is coupled to ground. The gate of transistor 310 is also coupled to ground so that transistor 310 is "off." Therefore, whatever current that flows through transistor 310 from node 109 to ground is leakage current through the gate oxide. The configuration of capacitor 205 illustrated in FIG. 3A can provide data to evaluate the N junction leakage current.

Figure 3B:
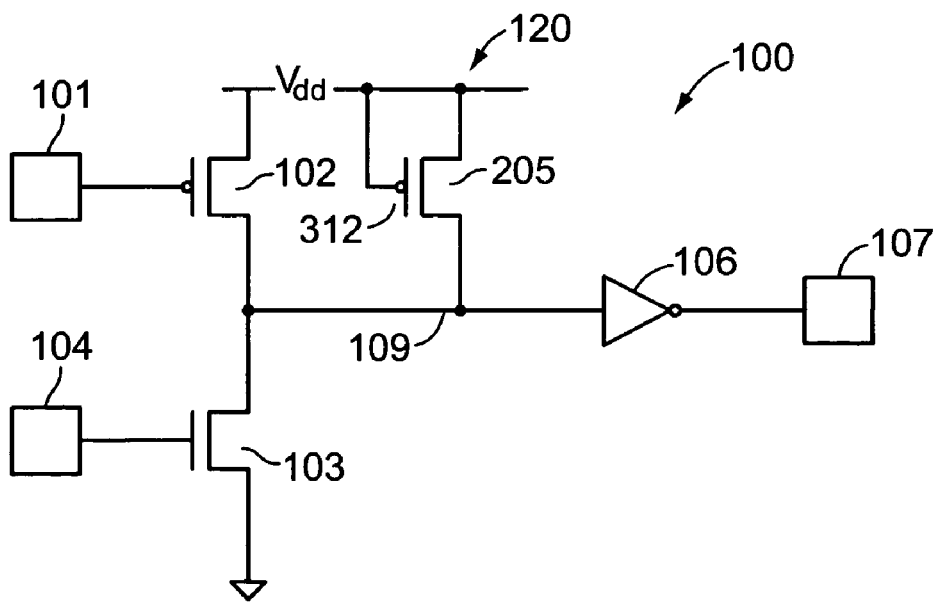
Figure 3C:
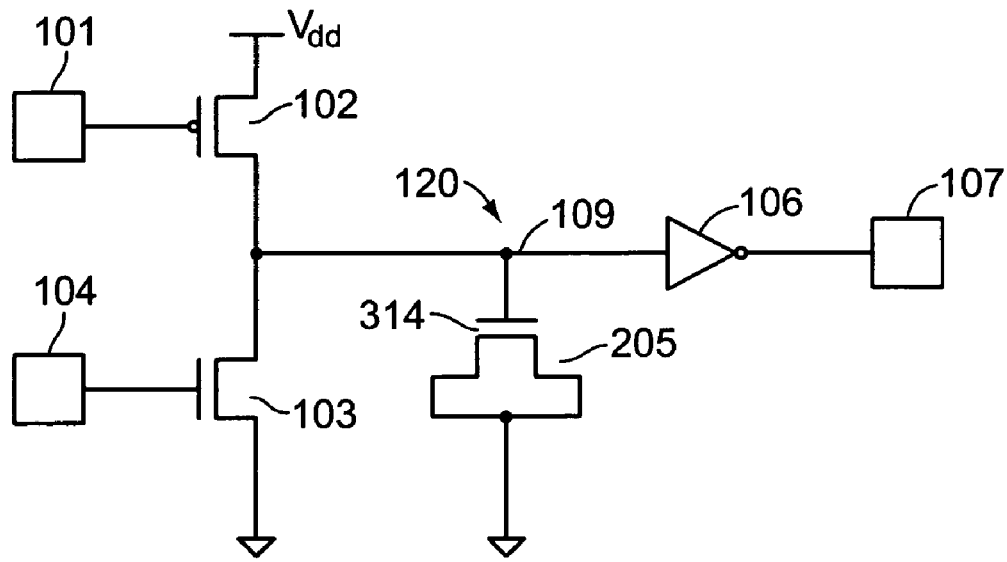

FIG. 3C, on the other hand, illustrates an embodiment of capacitor 205 that is appropriate to measurement of the N oxide leakage current. In the embodiment of capacitor 205 shown in FIG. 3C, the gate of a transistor 314 is coupled to node 109 while both the source/drains of transistor 314 are coupled to ground. The leakage current measured by the example of capacitor 205 shown in FIG. 3C, then, measures a leakage current in a direction through the gate oxide that is along a different path from the leakage current measured in the example of capacitor 205 shown in FIG. 3A.

Figure 3D:
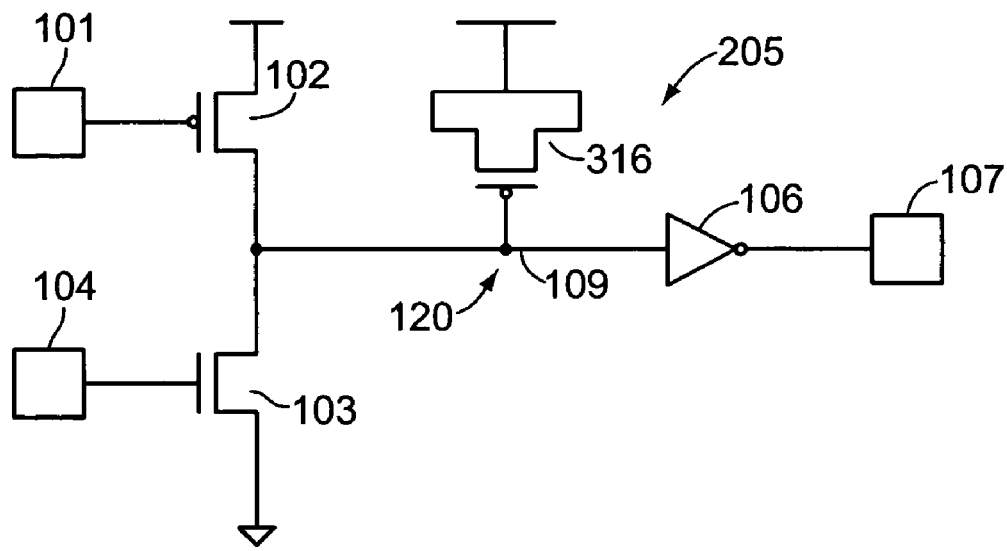

FIGS. 3B and 3D show examples of capacitor 205 coupled between node 109 and power Vdd rather than between node 109 and ground as was illustrated in FIGS. 3A and 3C. In FIG. 3B, capacitor 205 is implemented as transistor 312. One source/drain of transistor 312 is coupled to power Vdd while the opposite source/drain of transistor 312 is coupled to node 109. The gate of p-MOS transistor 312 is coupled to power Vdd so that transistor 312 is "off." The leakage current measured by test circuit 120 of FIG. 3B, then, is through the gate oxide between the two drains of p-MOS transistor 312.

Similarly in FIG. 3D, the embodiment of capacitor 205 of test circuit 120 is a p-MOS transistor 316 coupled such that the gate is coupled to node 109 and the two source/drains are coupled to power Vdd. Therefore, the leakage current measured by test circuit 120 shown in FIG. 3D is through the gate oxide between the gate and source/drains of transistor 316, rather than between the source/drains of transistor 312 as shown in FIG. 3B.

Test circuits for evaluating the integrity of dielectric material between interconnections are equivalent to the test circuits shown in FIGS. 3A through 3D for various leakage currents through a gate oxide. The dielectric material being tested replaces the gate oxide in the device structure.

All capacitances of interest, for example gate capacitance, line-to-line capacitance, line-over-line capacitance, diode capacitance, or other capacitances can be obtained in a similar fashion to the leakage current tests shown in FIGS. 2A and 3A through 3D. FIGS. 4A through 4F illustrate further measurements of leakage currents and capacitances according to embodiments of the present invention. Additional leakage tests are shown in FIGS. 4A through 4F.

In FIG. 2A, capacitor 205 can be a thin oxide gate capacitor with orders of magnitude greater leakage current than a similarly sized transistor fabricated with a thick gate oxide. For reasons of process control and device modeling, the capacitance of a thick gate oxide capacitor can be determined more accurately than a transistor with thin gate oxide. A thick oxide capacitor, like capacitor 410, is included in test circuits shown in FIGS. 4A through 4F. The size of the capacitance Cref used as the capacitance term to calculate the leakage current is a combination of the capacitance of the device under test and the thick oxide gate capacitor. Note that the capacitance of the input gates of output driver 106 is included for accuracy. Back biased diodes common to PN junctions found integrated circuits can be measured with the test circuits shown in FIGS. 4E and 4F. Metal line-to-line capacitances and metal line-over-line capacitances can be measured in a similar fashion as shown in FIGS. 3A through 4F. Further, line separation tolerances can be evaluated with a series of test structures with varying line separations which exceed minimum tolerances. Line-over-line leakage tests may require large area plates to form a capacitor in order to obtain statistically meaningful results.

Figure 4A:
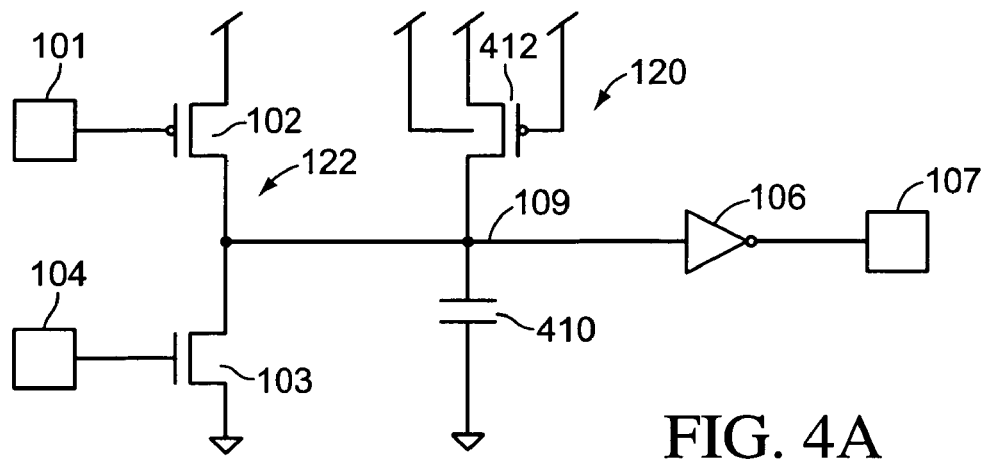
FIGS. 4A, 4B, 4C, 4D, 4E, and 4F illustrate further embodiments of leakage current testing circuits.
Figure 4B:
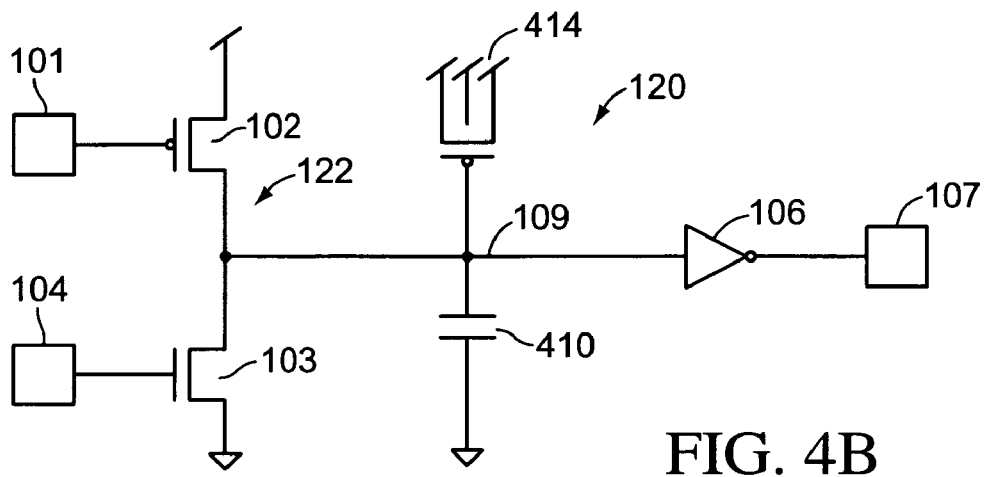

In each of the embodiments of parameter test circuit 120 shown in FIGS. 4A through 4B, parameter test circuit 120 includes a thick oxide gate capacitance that is functional as a reference capacitance 410. Reference capacitor 410, then, can be a capacitor with a thick oxide gate with a controlled thickness range. Capacitor 410, then, has substantially no oxide leakage. Such a capacitor is shown, for example, in FIG. 4A. A leakage current that is being tested, then, can be coupled with reference capacitor 410. Once capacitor 410 is discharged (i.e., node 109 is grounded), then the leakage current through the capacitance that is being tested is given by $$I_{leakage}=C_{ref}(\Delta V/\Delta t),$$

where $C_{ref}$ is the capacitance of reference capacitor 410, $\Delta V$ is the voltage change for the state of output driver 106 to change states, and $\Delta t$ is the time period, which can be measured in clock periods, beginning when reference capacitor 410 is fully discharged and ending when the voltage at node 109 has changed to the threshold voltage of the output transistor, $\Delta V$.

FIG. 4A illustrates, for example, an embodiment of parameter test circuit 120 for measuring a P-channel source drain leakage current. As shown in FIG. 4A, reference capacitor 410 is coupled between node 109 and ground. A p-transistor 412 is coupled between reference node 109 and voltage Vdd such that both the gate and substrate of transistor 412 are coupled to voltage Vdd. Capacitor 410 can then be discharged to ground by turning transistor 103 on. Capacitor 410 is then charged by leakage current through transistor 412. The period of time that it takes capacitor 410 to charge to a voltage sufficient for the output signal of driver 106 to change state can then be determined. In some embodiments, the voltage at which driver 106 will change state can be about Vdd/2. Therefore, where reference capacitor 410 begins charging at 0 volts, the charging time transition occurs at around $\Delta V=Vdd/2$.

FIG. 4B illustrates an embodiment of parameter test circuit 120 for measuring the leakage current through a p-channel gate. As shown in FIG. 4B, reference capacitor 410 is coupled between node 109 and ground and a p-MOS transistor 414 is coupled between node 109 and Vdd such that the gate of transistor 414 is coupled to node 109 and the source, drain, and substrate of transistor 414 are coupled to Vdd. Therefore, reference capacitor 410, from being grounded, is charged by the leakage current across the gate of p-MOS transistor 414. Again, the time of charging to about Vdd/2 can be determined by monitoring the output signal from driver 106.

Figure 4C:
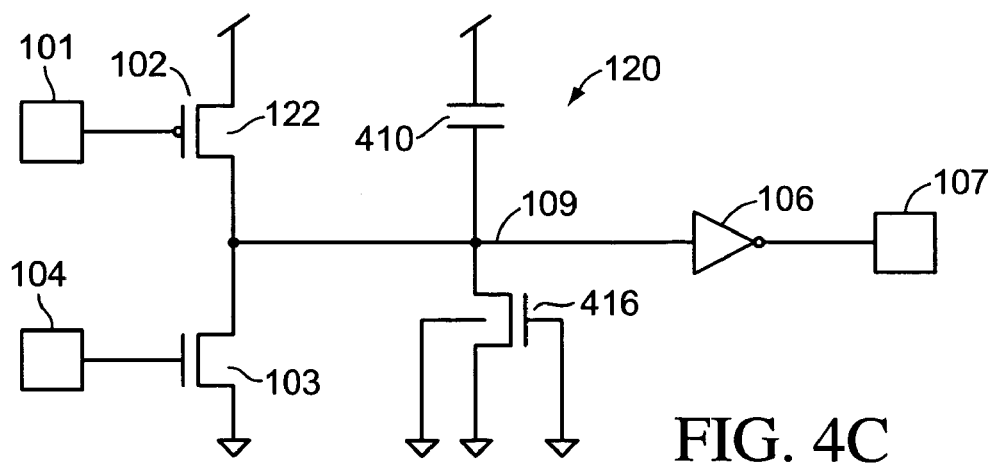

FIG. 4C illustrates an embodiment of parameter test circuit 120 for measuring an n-channel source drain leakage current. In the embodiment of test circuit 120 shown in FIG. 4C, reference capacitor 410 is coupled between node 109 and power supply voltage Vdd. Transistor 416, an n-MOS transistor, is coupled between node 109 and ground such that a source of transistor 416 is coupled to node 109 and the drain, substrate, and gate of transistor 416 is coupled to ground. In this example, reference capacitor 410 is discharged by turning transistor 102 on and coupling node 109 to voltage Vdd. Capacitor 410 is then charged by the leakage current through transistor 416. Again, the time for the voltage at node 109 to reach about Vdd/2 is timed to determine the leakage current.

Figure 4D:
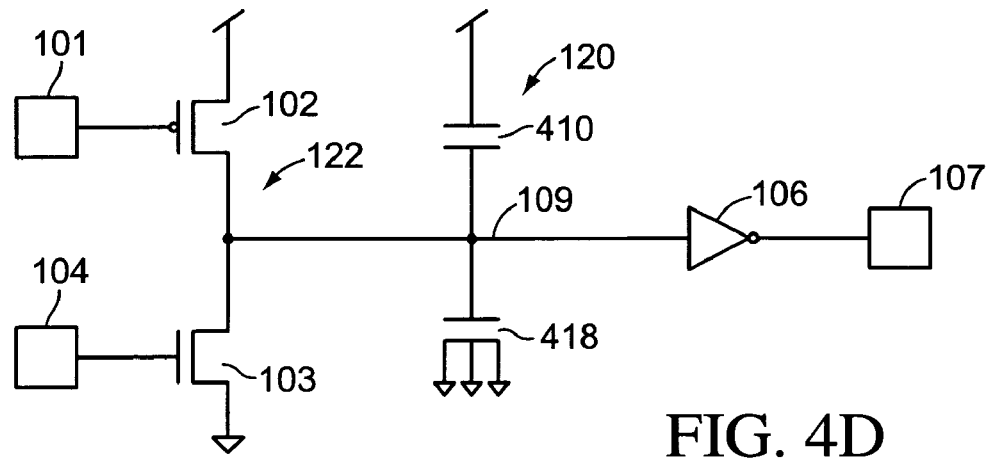

FIG. 4D illustrates an embodiment of test circuit 120 for measuring an n-channel gate leakage current. As shown in FIG. 4D, reference capacitor 410 is coupled between node 109 and voltage Vdd. An n-channel transistor 418 is coupled between node 109 and ground such that the gate of transistor 418 is coupled to node 109 and the gate, source, and substrate of transistor 418 is coupled to ground. Capacitor 410, then, is discharged by a leakage current across the gate of transistor 418.

Figure 4E:
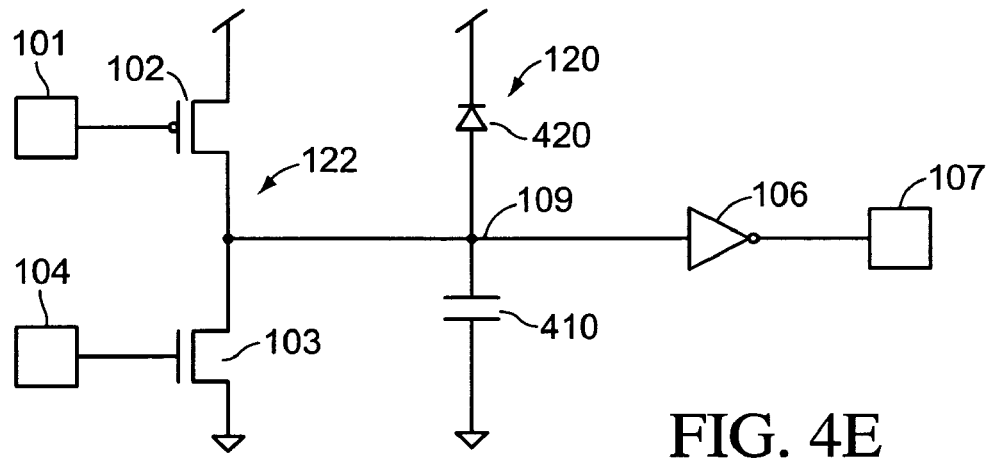

FIG. 4E illustrates an embodiment of parameter test circuit 120 for measuring an n-well leakage current. Reference capacitor 410 is coupled between node 109 and ground. A diode structure is coupled between node 109 and Vdd. Capacitor 410 is then charged by the leakage current through diode 420.

Figure 4F:
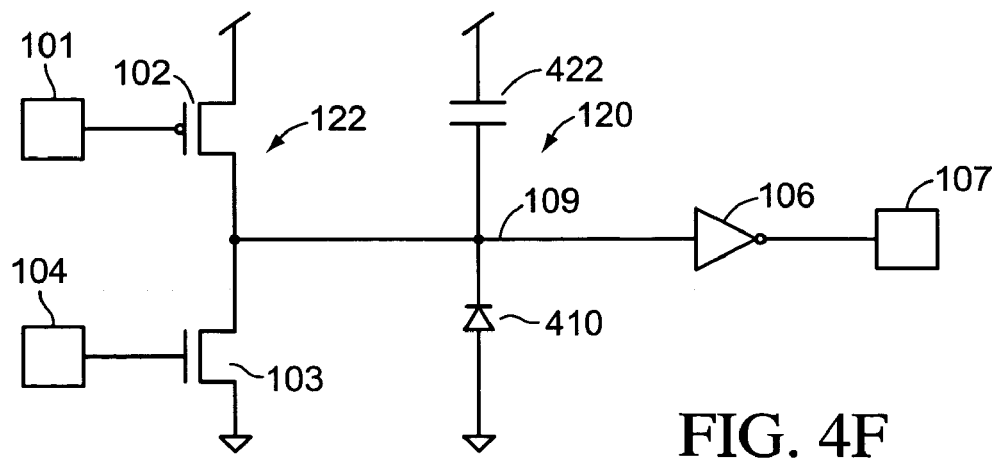

FIG. 4F illustrates an embodiment of parameter test circuit 120 for measuring the leakage current through a capacitance 422. Capacitance 422 can be any interconnect, for example parallel lines, crossing lines, or other capacitively coupled structures. As shown in FIG. 4F, reference capacitor 410 is coupled between node 109 and ground. The capacitance to be tested is coupled between node 109 and Vdd. One skilled in the art will recognize that reference capacitor 410 and capacitor 422 can be reversed in some embodiments. In the embodiment shown in FIG. 4F, reference capacitor 410 is charged by the leakage current through capacitor 422.

Figure 5A:
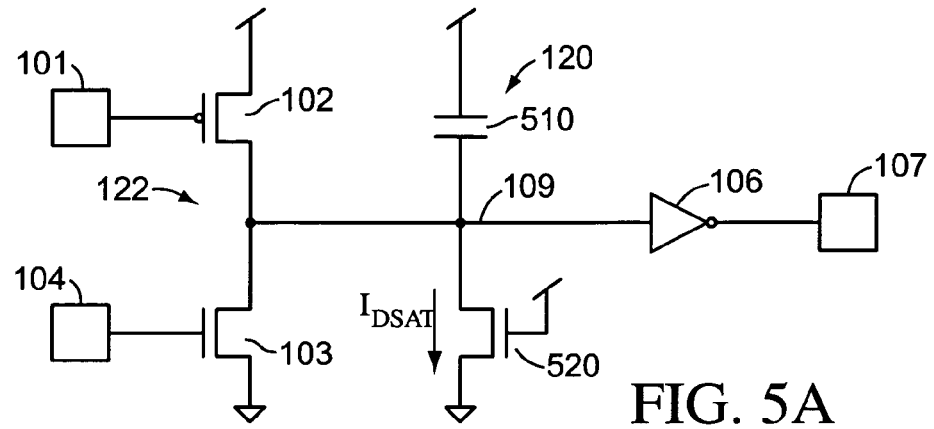
FIGS. 5A, 5B, 5C, and 5D illustrate embodiments of test circuits for measuring saturation currents according to some embodiments of the present invention.
Figures 5B, 5C:
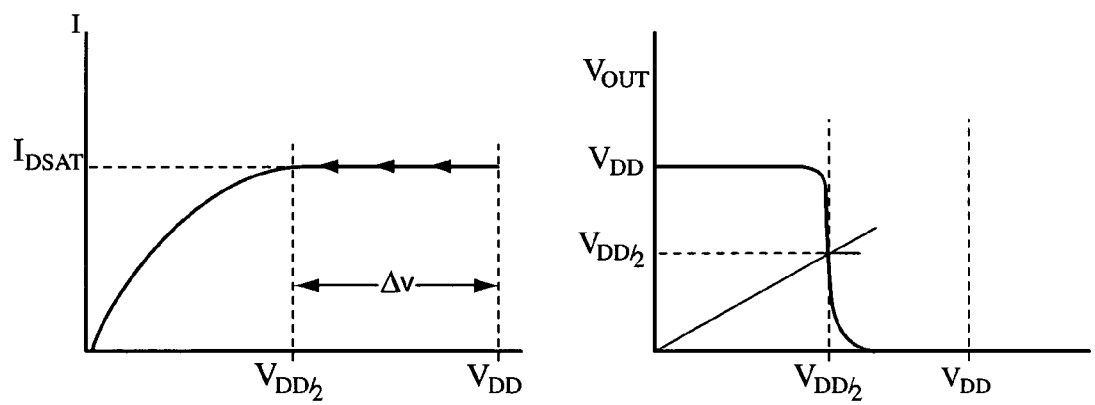

FIGS. 5A through 5D illustrate n-channel and p-channel saturation current measurements according to some embodiments of the present invention. FIG. 5B illustrates the loci of data points of an n-channel saturation current versus source drain voltage. As shown in FIG. 5A, parameter test circuit 120 for obtaining the saturation current for a n-channel transistor 520 includes a reference capacitor 510 coupled between node 109 and power supply Vdd. Reference capacitor 510 can be a large area capacitor formed with a thick oxide gate. Transistor 520 is coupled between node 109 and ground and the gate of transistor 520 is coupled to voltage Vdd, thereby turning transistor 520 on.

Initially, terminal 104 is brought low, turning transistor 103 off. Terminal 101 is also brought low, turning transistor 102 on, coupling node 109 to voltage Vdd. Terminal 101 is then brought high, turning transistor 102 off, and node 109 is then drawn to ground by the saturation current $I_{DSAT}$ through transistor 520. FIG. 5B illustrates the relationship between the current and the voltage at node 109 while the voltage at node 109 is pulled to ground. Note that $I_{DSAT}$ is represented at the flat portion of the curve, corresponding to the beginning of the transmission of current through transistor 520.

The transition characteristics, $V_{out}$ versus $V_{in}$, of output driver 106 is illustrated in FIG. 5C. Typically, the transition of the output signal from low signal to high signal will occur substantially at a voltage of Vdd/2. As shown in FIG. 5B, the flat portion of the source-drain current versus source-drain voltage curve, from which the parameter $I_{DSAT}$ is drawn, also ends at or near the voltage Vdd/2. Therefore, the value of the saturation current $I_{DSAT}$ can be determined by timing the voltage decay between Vdd and the transition of driver 106, Vdd/2. The saturation current can be given by $$I_{DSAT} = \Sigma C(\Delta V/\Delta t),$$

where $\Sigma C$ is the summation of capacitances on node 109 (including parasitic capacitances), $\Delta V$ is the change in voltage that occurs at node 109 to cause driver 106 to change state (about Vdd/2), and $\Delta t$ is the time (usually measured in integral numbers of clock cycles) from when transistor 102 is shut off and the output signal from driver 106 changes from a low to a high state.

Figure 5D:
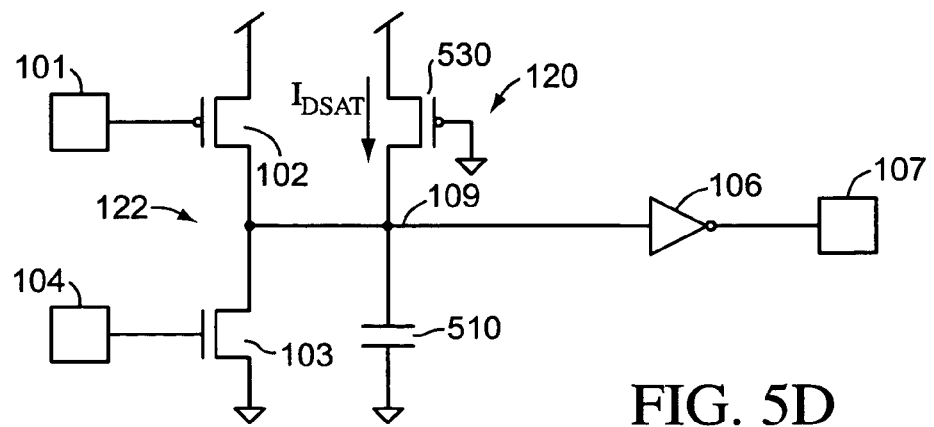

FIG. 5D illustrates a parameter test circuit 120 for measuring the saturation current through a p-MOS transistor 530. As shown in FIG. 5D, parameter test circuit 120 includes test capacitor 510 coupled between node 109 and ground and a p-MOS transistor 120 coupled between node 109 and voltage Vdd. The gate of transistor 530 is coupled to ground and therefore transistor 530 is on. During the test, node 109 is grounded by turning transistor 103 on and the voltage at node 109 is monitored for a change in voltage from ground to about Vdd/2. As discussed above, the saturation current can be determined by determining the time interval between when transistor 103 is shut off and when driver 106 changes state, indicating a rise in voltage at node 109 of about Vdd/2.

Figure 6A:
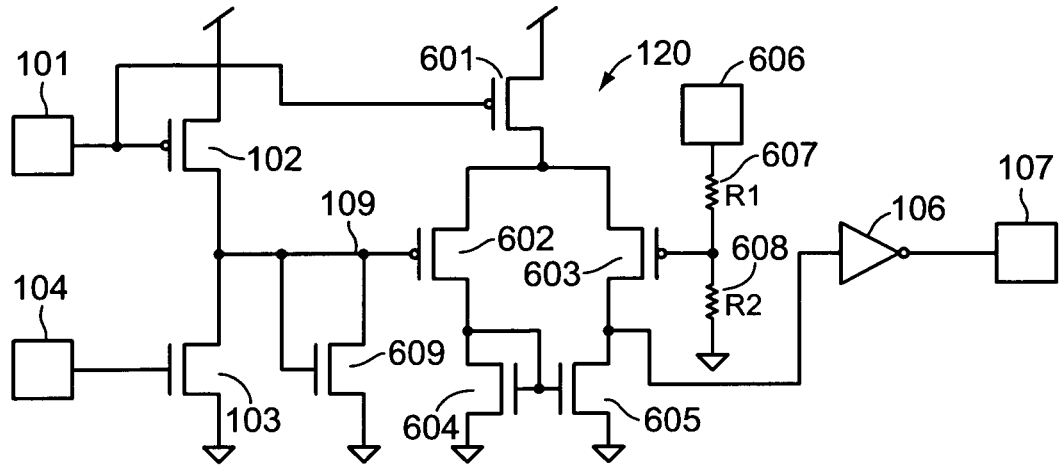
FIGS. 6A and 6B illustrate embodiments of test circuits for measuring threshold voltages according to some embodiments of the present invention.
Figure 6B:
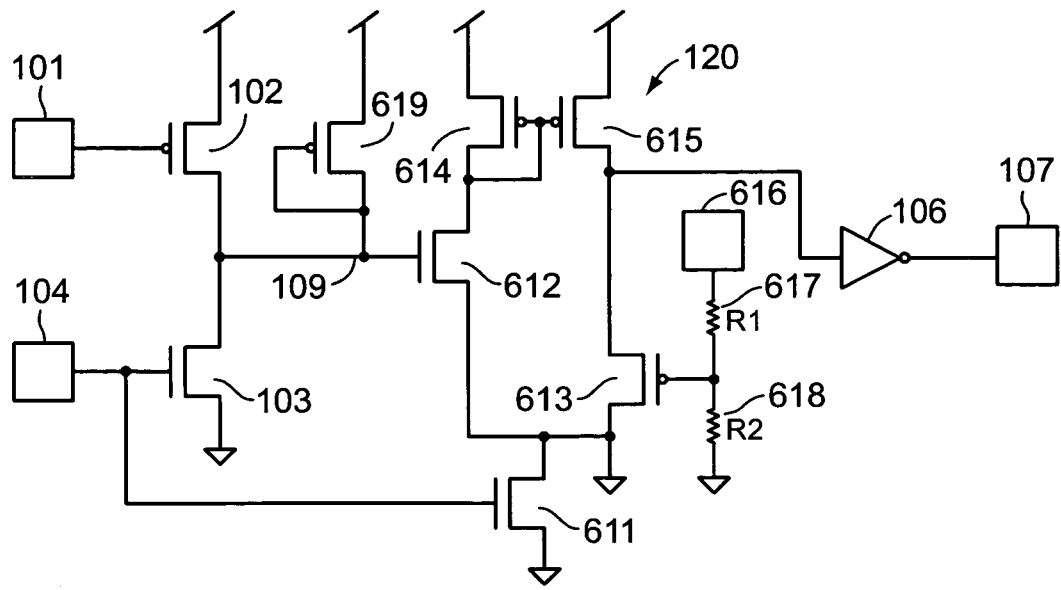

FIGS. 6A and 6B illustrate examples of parameter test circuit 120 for testing device thresholds. Parameter test circuit 120, as shown in FIG. 6A, includes a differential current mirror circuit formed with p-MOS transistors 602 and 603 coupled with n-MOS transistors 604 and 605. n-MOS transistors 604 and 605 are coupled as current loads with transistors 602 and 603. The gate of transistor 602 is coupled to node 109 while the gate of transistor 603 is coupled to a voltage divider formed from resistors 607 and 608. The voltage signal applied to series coupled resistors 607 and 608 can be applied to terminal 606 and, during the test, is ramped. A voltage of Vdd can be applied to transistors 602 and 603 through p-MOS current source transistor 601, which is switched by a voltage signal on terminal 101. When a low voltage signal is applied to transistor 101, transistor 102 and transistor 601 are on and voltage Vdd is applied to node 109 and transistor 602, the device under test.

As shown in FIG. 6A, the device under test is a n-MOS transistor 609 coupled between node 109 and ground. The gate of transistor 609 is coupled to node 109. When a low voltage signal is applied to terminal 101, current can flow through transistor 102 and transistor 609. The voltage applied to terminal 606 is ramped until the output signal from driver 106 switches, indicating that a threshold voltage of transistor 609 at node 109 has been reached. The threshold of the device under test can be correlated to the point on the sweep of the voltage applied to node 606 where the output driver switches, for example, from a look-up table.

FIG. 6B shows a similar circuit for measuring the threshold voltage of p-MOS transistor 619. As shown in FIG. 6B, a differential input current mirror is formed with n-MOS transistors 612 and 613 and load transistors 614 and 615. The gate of transistor 612 is coupled to node 109 and the gate of transistor 613 is coupled to a voltage divider formed from resistors 617 and 618. The voltage for the terminals of resistor 617 is supplied from terminal 616. The input to driver 106 is the voltage from the drain of transistor 613. Again, the test begins with a high signal applied to terminal 104, that turns transistor 103 and transistor 611 on. A ramp voltage is applied to terminal 616 and the voltage where the output signal from driver 106 switches is measured. The threshold voltage of transistor 619, then, can be determined from a look-up table.

In some embodiments, a threshold voltage measuring from forward biased diodes can be obtained in similar fashion. Further, one skilled in the art will recognize that other circuits according to the present invention can also be utilized for measurement of the threshold voltages of transistors 609 and 619.

Figure 7A:
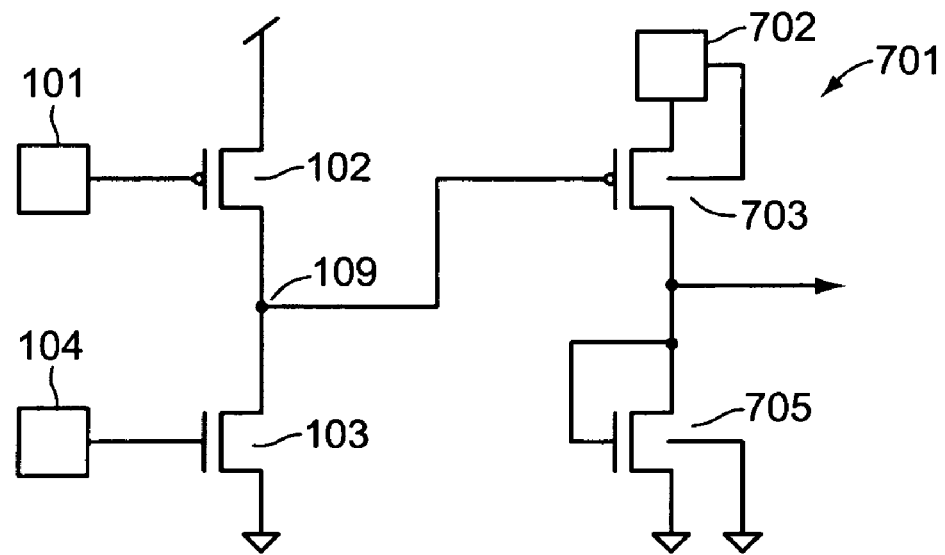
FIGS. 7A and 7B illustrate embodiments of test circuits for testing of various transistor threshold levels according to some embodiments of the present invention.
Figure 7B:
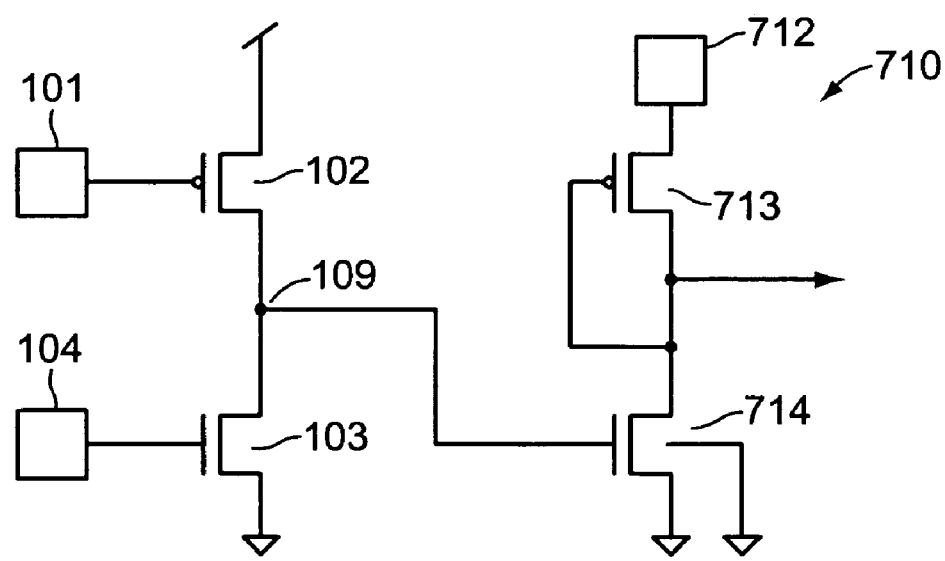

FIGS. 7A and 7B, for example, illustrate further embodiments of circuits for testing of various transistor thresholds. FIG. 7A, for example, illustrates an n-channel threshold test circuit 701. Test circuit 701 includes n-channel transistor 705. The source of transistor 703 along with the body of transistor 703 are coupled to voltage a terminal 702, which during the test can be ramped in voltage. The drain of transistor 703 is coupled to the source of transistor 705. The drain and body of transistor 705 is coupled to ground. The gate of transistor 705 is coupled to the source of transistor 705, which also supplies the output signal of test circuit 701. The gate of transistor 703 is coupled to node 109 between transistors 102 and 103. During a test, transistor 703 is turned on and a voltage on pad 702 is ramped. The output signal at the drain of transistor 703, then, provides a voltage that is dependent on the threshold voltage of transistor 705.

FIG. 7B illustrates a p-channel threshold test circuit 710. Test circuit 710 includes p-channel transistor 713 and n-channel transistor 714. The drain and body of transistor 714 are coupled to ground. The source of transistor 714 is coupled to the drain and the gate of transistor 713 and also provides the output signal of test circuit 710. The source and body of transistor 713 are coupled to pad 712. The gate of transistor 714 is coupled to node 109. During the test, transistor 714 is turned on and a ramped voltage is supplied to pad 712. Again, the output signal provided at the drain of transistor 713 is dependent on the threshold voltage of transistor 713.

Figure 7C:
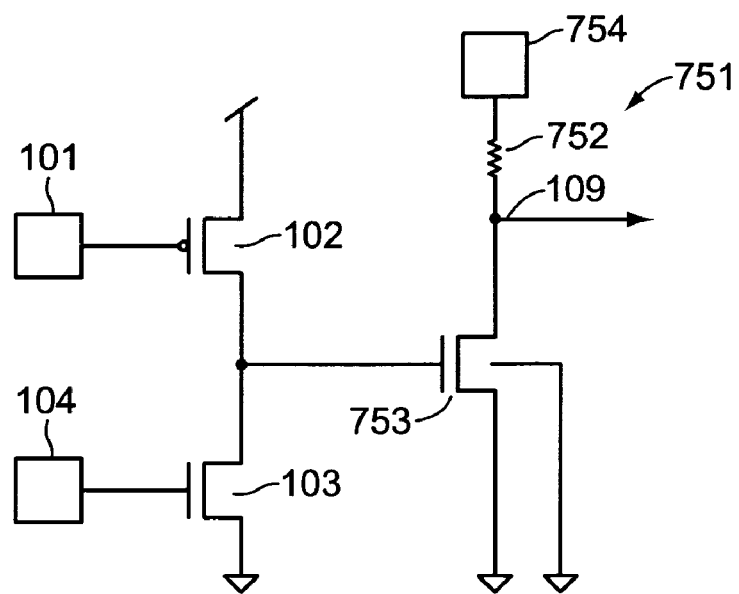
FIGS. 7C and 7D illustrate embodiments of test circuits for monitoring drain currents according to some embodiments of the present invention.
Figure 7D:
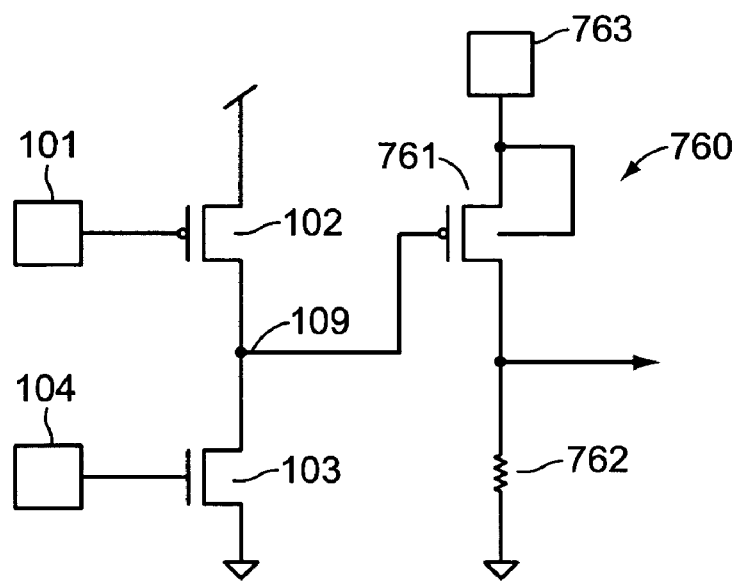

Examples of test circuits to monitor drain currents are shown in FIGS. 7C and 7D. Test circuit 751 shown in FIG. 7C monitors n-channel transistor drain current and test circuit 760 shown in FIG. 7D monitors p-channel transistor drain current. As shown in FIG. 7C, test circuit 751 includes a resistor 752 coupled between a pad 754 and the source of a n-channel transistor 753. The gate of n-channel transistor 753 is coupled to node 109 and the drain is coupled to ground. The body of transistor 753 is also coupled to ground. During a test, transistor 753 is turned on and a ramped voltage is supplied to pad 754. The output signal taken from the source of transistor 753 is dependent on the source-drain current through transistor 753.

An example of test circuit 760 for monitoring the p-channel drain current is shown in FIG. 7D. Test circuit 760 includes a p-channel transistor 761 and a resistor 762. Resistor 762 is coupled between the drain of transistor 761 and ground. The source and body of transistor 761 are coupled to pad 763. The gate of transistor 761 is coupled node 109. During a test, transistor 761 is turned on and a ramped voltage is supplied to pad 763. The output signal from test circuit 760 is taken from the drain of transistor 761 and depends on the source-drain current through transistor 761. In some embodiments, the power to test circuits 751 and 670 (as well as, for example, circuits 701 and 710 of FIGS. 7A and 7B) may be switched off when testing is not being performed in order to save power.

Figure 8:
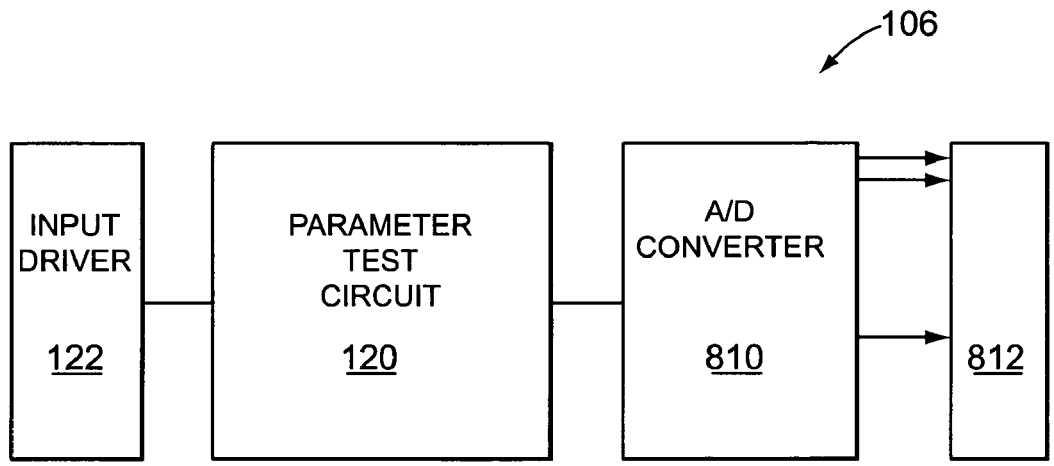
FIG. 8 illustrates an embodiment that measures voltage levels.

In some embodiments of the invention, the output signal from parameter test circuit 120 can be input to an analog-todigital (A/D) converter. FIG. 8 illustrates an embodiment where output driver 106 is an A/D converter. As shown in FIG. 8, the output signal from parameter test circuit 120 is input to A/D converter 810. The digitized output signal can then be input to a buffer 812, where it can be read by a testing circuit. Utilizing a digital-to-analog converter allows for measurement of parameters that are not dependent on a transition level of an inverting driver such as that illustrated in FIG. 1A.

Figure 9A:
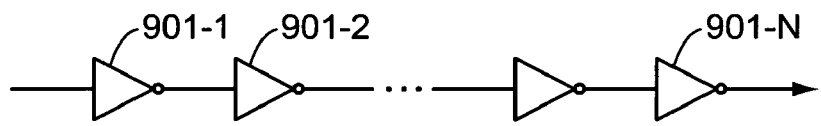
FIGS. 9A and 9B illustrate embodiments of test circuits for monitoring circuit performance according to some embodiments of the present invention.
Figure 9B:
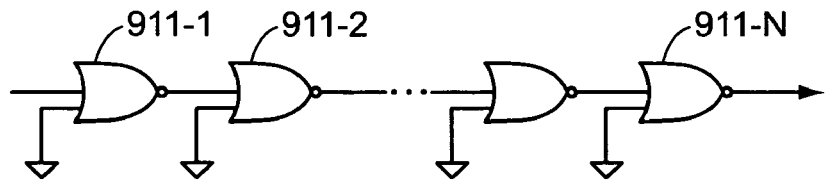

FIGS. 9A and 9B illustrate some examples embodiments of parameter test circuit 120 for monitoring time delays in gate circuits. Test circuit 120 of FIG. 9A includes a delay line having serially coupled inverters 901-1 through 901-N. The time of transition for a signal entering inverter 901-1 and exiting 901-N can be measured by counting a number of clock cycles and indicates the performance of inverter circuitry. FIG. 9B illustrates an embodiment of parameter test circuit 120 with a similar delay path formed of NOR gates 911-1 through 911-N.

Again, one skilled in the art will recognize from the circuits disclosed herein other tests to monitor or determine device parameters. In some embodiments, each of the circuits utilized for test circuits are designed within the compatibility constraints for standard devices on the integrated circuit. The circuits, therefore, can be designed within the compatibility constraints of standard cells used within standard cell place and route layout software utilized to design the integrated circuit as a whole.

Embodiments of device parameter test circuits such as those described herein are therefore embedded on the integrated circuit itself. In some embodiments, such circuits are incorporated within an integrated circuit testing environment that is already designed in place on the chip. For example, tests utilizing these test circuits can be included within the boundary scanning tests included in the "IEEE Standard Test Access Port and Boundary-Scan Architecture", IEEE Standard 1149 (2001) or "IEEE Standard for Boundary-Scan Testing of Advanced Digital Networks," IEEE Standard 1149.6 (2003), which are herein incorporated by reference in their entirety. Furthermore, embodiments of the invention can be incorporated into a standard cell library utilizing place and route software and scan path software. Therefore, parameter testing circuits according to the present invention can be easily incorporated into an integrated circuit.

Figure 10:
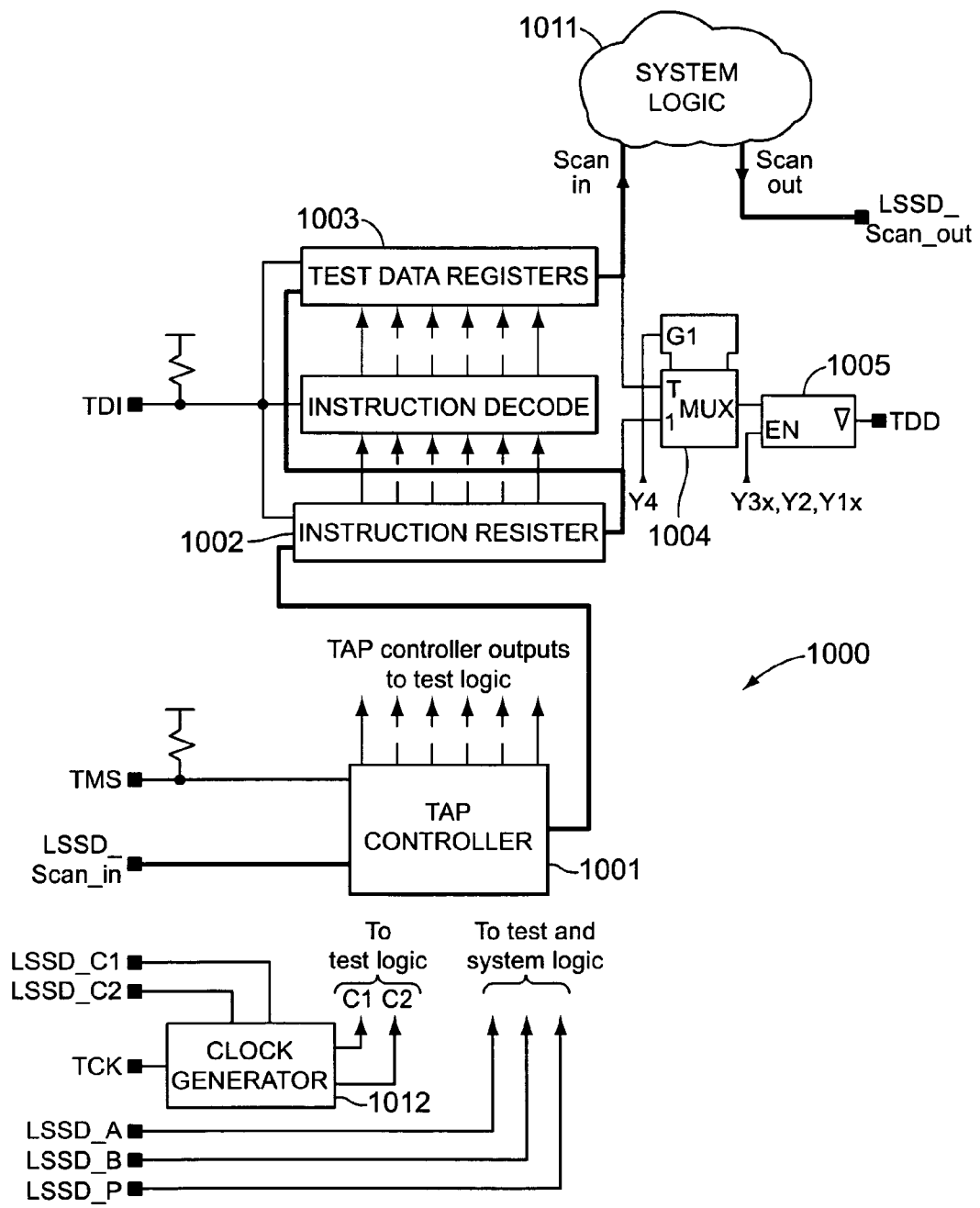
FIG. 10 illustrates a test structure on an integrated circuit for performing device parameter testing according to some embodiments of the present invention.

FIG. 10 illustrates a test structure according to the IEEE 1149 or the IEEE 1149.6 standards. As shown in FIG. 10, the input pins on the integrated circuit include a test mode select (TMS) pin, a test clock input (TCK) pin, an optional test reset (TRST) pin, a test data input (TDI) pin, and a test data output (TDO) pin. All tests are controlled and operated through shift-register based test data registers 1003 and instruction registers 1002. A test access port (TAP) controller 1001 controls the input of data and instructions from the TDI pin and the output of test data from the TDO pin according to the TMS, TCK, and TRST signals from the TMS, TCK, and TRST pins, respectively. TAP controller 1001 can be a synchronous finite state machine that responds to changes at the TMS and TCK signals and controls the sequence of operations of the circuitry. Rules governing the behavior of the test logic are defined in the IEEE 1149 standard.

The test access port (TAP), as shown in FIG. 10, includes a TCK pin, a TMS pin, a TDI pin, and a TDO pin. In some embodiments, the TAP includes a TRST pin. The TCK pin receives a TCK signal that is an external clock. A separate external clock is supplied to the integrated circuit so that the serial inputs and outputs of each TAP on separate integrated circuits can be utilized independently of system clocks that may apply only to individual integrated circuits. In some embodiments, the TCK signal can be input to a clock generator 1012, which can then provide various clock signals to the testing circuit. In some embodiments, the precision of the test result can be increased by increasing the clock rate of signal TCK.

The TMS signal is received and decoded by TAP controller 1001. The TMS signal is typically sampled on a rising edge of the TCK signal. The TDI signal is a serial test instruction or data signal that is loaded into test data registers 1003 or instruction register 1002. The type of test being performed is determined by data loaded into instruction register 1002 and data for performing a particular test or series of tests is loaded into test data registers 1003. As discussed before, test data registers 1003 and instruction register 1002 can be shift registers that are loaded from the TDI signal in response to the TCK signal. Multiplexer 1004 provides output signals from either test data registers 1003 or instruction register 1002 to an output stage 1005.

As shown in FIG. 10, a system logic 1011 can be provided for logic and timing to test data registers 1003. Data from test data registers 1003 and data into instruction registers 1002 can be coupled to system logic 1011. System logic 1011, then, can control the test circuit and can provide some analysis of the resulting data.

Figure 11A:
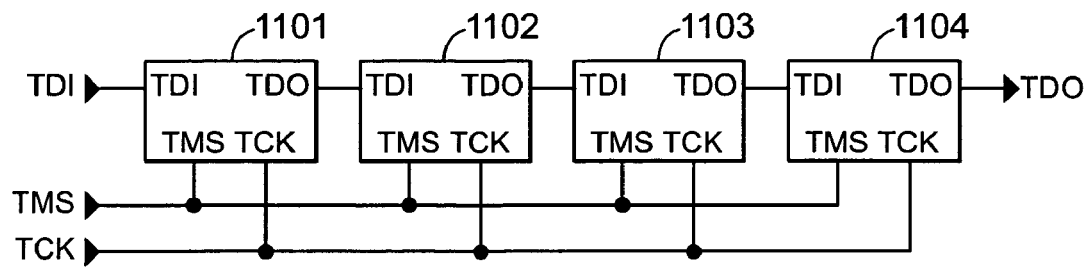
FIGS. 11A and 11B illustrate interconnecting multiple integrated circuits with the device parameter testing system shown in FIG. 10.
Figure 11B:
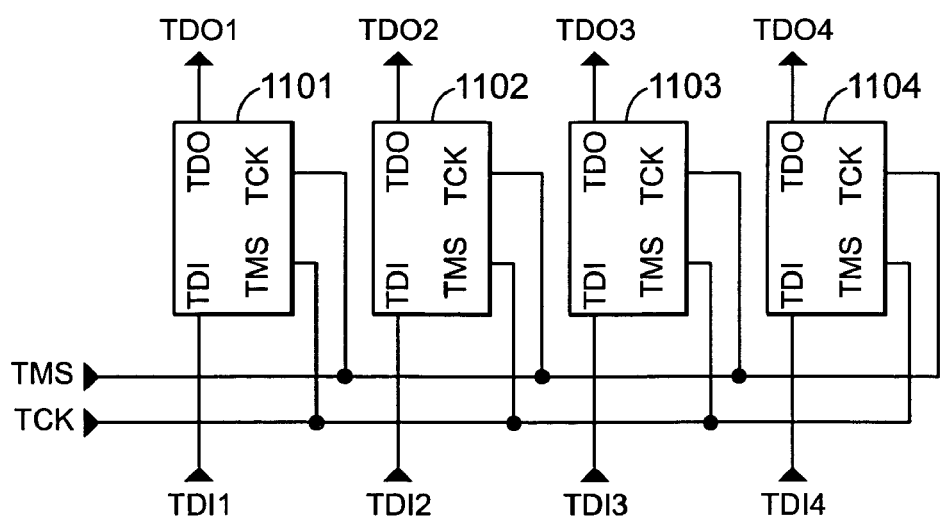

Individual integrated circuits can therefore be interconnected in various ways utilizing the test structure shown in FIG. 10. As shown in FIGS. 11A and 11B, several components can be interconnected. In FIG. 11A, for example, the TAP circuits of components 1101, 1102, 1103, and 1104 are coupled serially. In FIG. 11B, the TAP circuits of components 1101, 1102, 1103, and 1104 are coupled in parallel.

Figure 12:
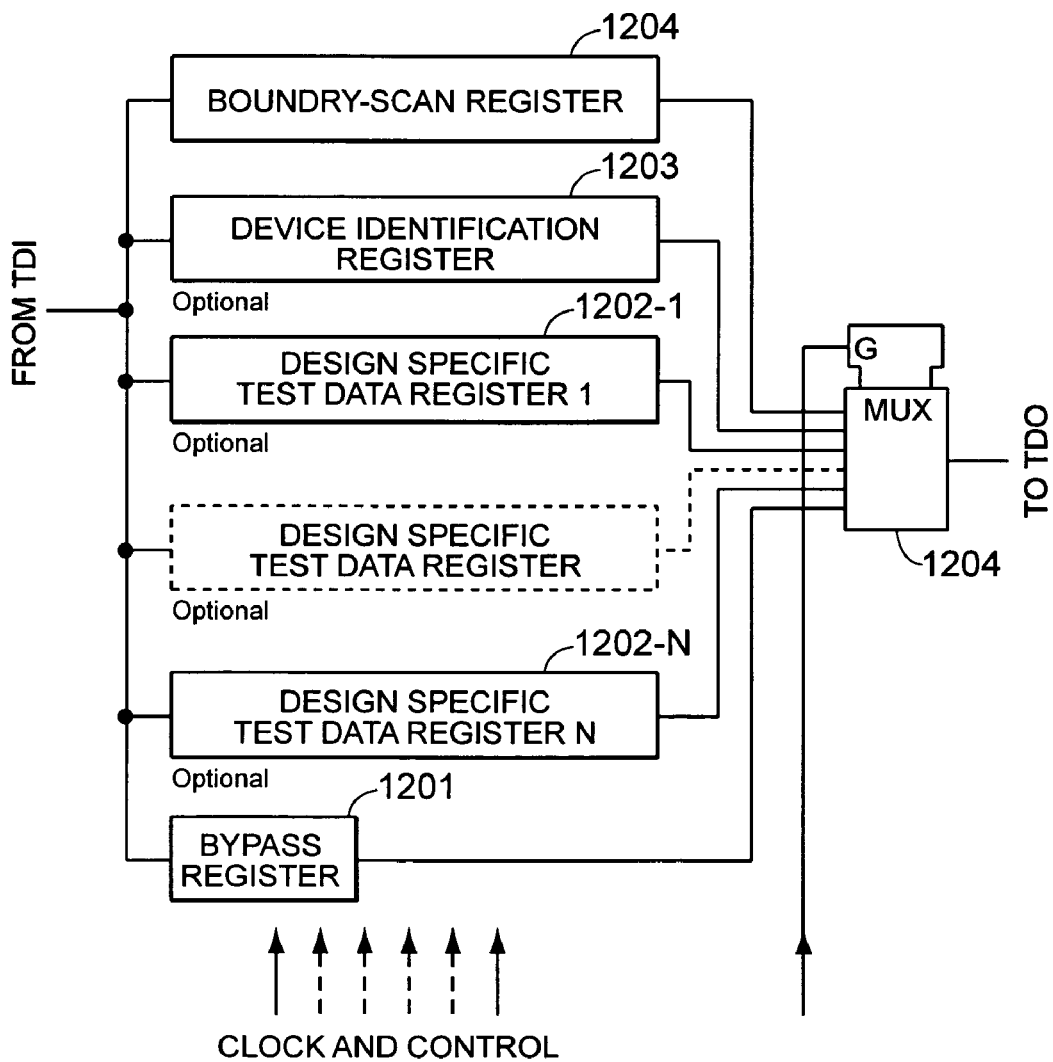
FIG. 12 illustrates an example of a register structure in the test structure shown in FIG. 10.

FIG. 12 further illustrates an example of the register structure of FIG. 10. As shown in FIG. 12, there can be any number of registers in addition to instruction register 1002, including a bypass register 1201, design specific test registers 1202-1 through 1202-N, identification register 1203, and boundary scan register 1204. Bypass register 1201 provides a single-bit serial connection through the circuit when none of the other test data registers is selected. Bypass register 1201 can be utilized to allow test data to flow through a device to other components without affecting the normal operation of any component. Boundary scan register 1204 allows testing of board interconnection, detecting typical production defects such as opens, shorts, etc., and allows access to the inputs and outputs of components when testing system logic or sampling of signals flowing through the system inputs and outputs. Device identification register 1203 can optionally be provided to allow a manufacturer, part number, and/or variant of a component to be determined. Test data registers 1202-1 through 1202-N are provided for access to design-specific test support features in the integrated circuits. These may be self-tests, scan paths, or, in accordance with the present invention, device parameter monitoring.

Figure 13:
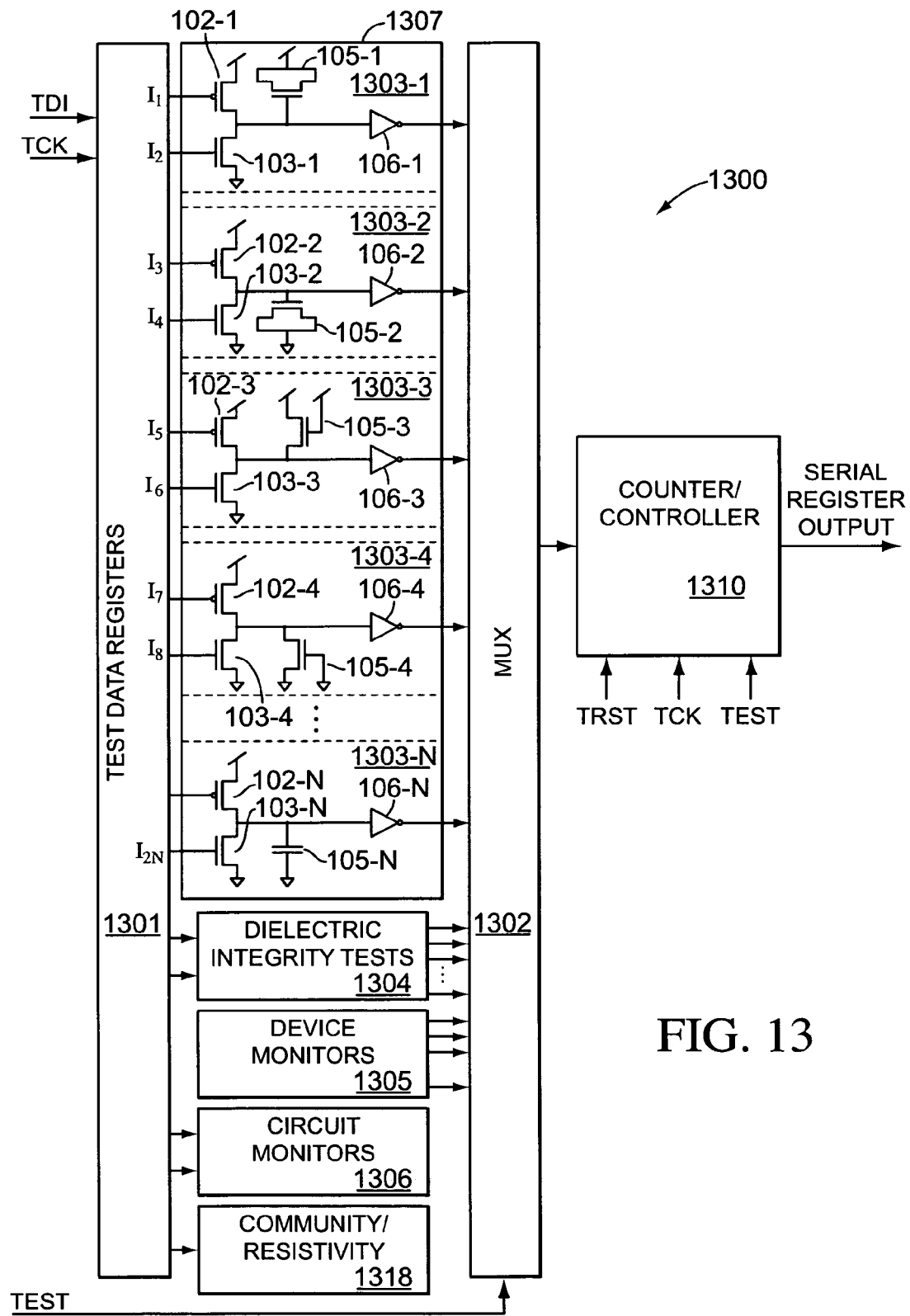
FIG. 13 illustrates an example of device parameter testing with the test structure shown in FIG. 10.

FIG. 13 illustrates a test structure according to some embodiments of the present invention. Device parameter tests, such as leakage current tests 1307, device integrity tests 1304, device monitors 1305, circuit monitors 1306, and continuity/resistivity tests 1308 are coupled between test data registers 1301 and multiplexer 1302. Test data registers 1301 can be one or more of the design specific test data registers 1202-1 through 1202-N shown in FIG. 12. Data for performing individual tests can be loaded serially according to the TCK signal into test data registers 1301 from the serial data signal TDI.

As shown in leakage current test 1307, for example, leakage characterization circuit 1307 can include any number of individual leakage current tests. In the embodiment shown in FIG. 13, leakage current test circuits 1303-1 through 1303-N are shown. As shown in FIG. 13, leakage current test circuits 1303-1 through 1303-N can each include transistors 102-1 through 102-N, transistors 103-1 through 103-N, capacitors 105-1 through 105-N, and inverters 106-1 through 106-N, respectively, as described with FIG. 2A. In each of the N leakage current test circuits 1303-1 through 1303-N, capacitors 105-1 through 105-N can be different leakage current configurations, or may be placed in a different physical location on integrated circuit 150 (see FIG. 2C). Each of leakage current test circuits 1303-1 through 1303-N, then, can provide different data related to the leakage current on integrated circuit 205.

Dielectric integrity tests 1304 can include, for example, leakage current testing circuits such as those shown for gate oxide leakage current circuits in test 1307 formed to provide leakage currents through other dielectrics. Device monitor tests 1305 can, for example, include the n-channel threshold test and p-channel threshold tests discussed with respect to FIGS. 6A and 6B or FIGS. 7A and 7B and other device monitor tests. Circuit monitor tests 1306 can, for example, include the delay circuits shown in FIGS. 9A and 9B. Other device monitor tests can also be included.

The output signals from each of device monitor tests 1304, 1305, 1306, and 1307 can be input to a multiplexer 1302. Multiplexer 1302 of characterization circuit 1300 outputs a signal from test 1304, 1305, 1306, and 1307 in response to a test select signal. Input signals to test circuits 1304, 1305, 1306, and 1307 can be loaded into test data registers 1301. For example, input signals $I_1, I_2, I_3, I_4, I_5, I_6, I_7,$ and $I_8$ through $I_{2N-1}$ and $I_{2N}$ are input to leakage current circuits 1303-1 through 1303-N. The signals from register 1301 can be timed to affect a timing such as that described with respect to FIGS. 2A and 2B in order to perform individual leakage current tests with individual ones of leakage current circuits 1303-1 through 1303-N.

The output signal from multiplexer 1302 can be input to counter/controller 1310, which may be included in an external tester. As was discussed above, many of the device parameter tests (e.g., dielectric integrity tests 1304, circuit monitors 1306, and gate oxide leakage tests 1307) are performed by measuring a time interval. A leakage current test, for example, involves timing the interval of decay of capacitor 205. Some tests, however, may require determination of a voltage level indicative of a source-drain current, such as the test shown in FIGS. 10A and 10B.

Counter/controller 1310 receives a reset signal TRST, a clock signal TCK, and a test signal indicating the test being performed. In response, counter/controller 1310 provides a serial output TDO with the resulting data from the test. For example, in a leakage current test, the clock signal would be used to drive a counter that counts throughout the time that capacitor 205 is decaying to a threshold voltage and outputs the counter number at completion of the test.

FIGS. 14A through 14E illustrate utilization of parameters obtained from process, device, and circuit testing according to the present invention to adjust circuit parameters on an integrated chip. The measured saturation currents, for example, can be utilized in the adjustment of current drives for internal clock drivers, external output pad drivers, or virtually any other analog circuit.

Figure 14A:
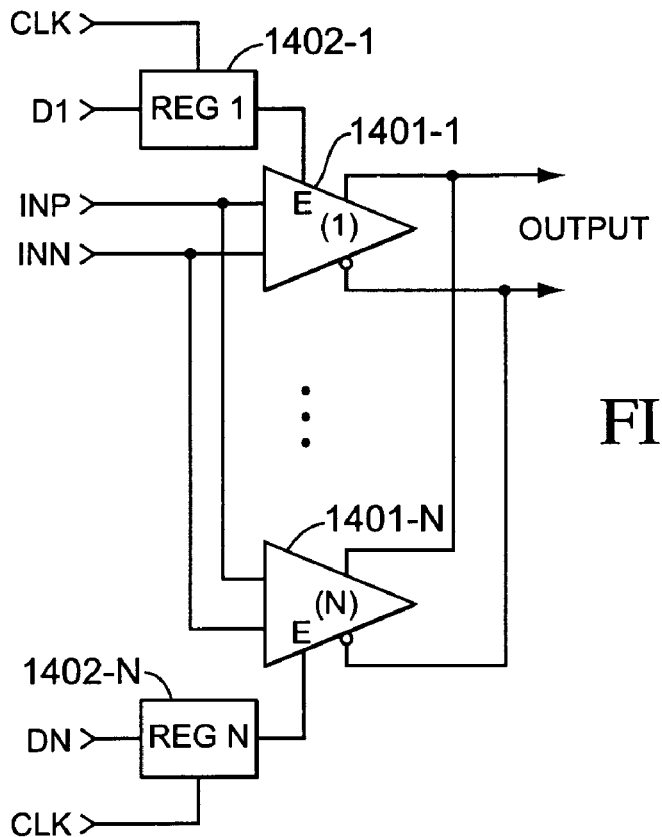
FIGS. 14A through 14E illustrate utilization of parameters obtained by device parameter testing according to embodiments of the present invention to adjust circuit parameters in the integrated circuit.

In FIG. 14A, an adjustment in output driver current is produced by way of the enable pins and registers on parallel drivers. As shown in FIG. 14A, the enable terminals of drivers 1401-1 through 1401-N are coupled to registers 1402-1 through 1402-N. The output signals from each of drivers 1401-1 through 1401-N are coupled so that the output signal is the sum of all of drivers 1401-1 through 1401-N. Registers 1402-1 through 1402-N receives the digitized value of, for example, a threshold voltage parameter. The output signal is thereby dependent on the measured value of a parameter measured by a parameter test according to the present invention.

Figure 14B:
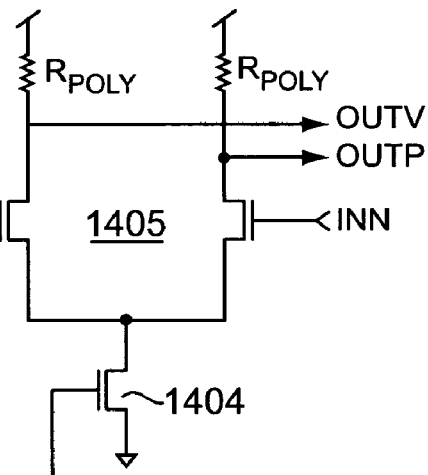
Figure 14B:
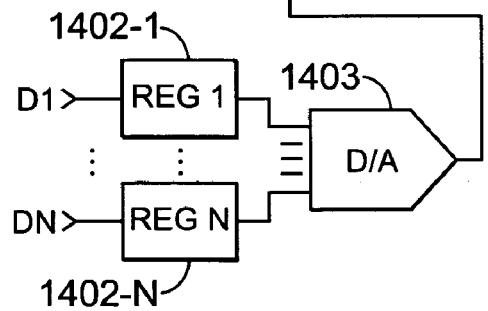

Another method of adjusting circuit performance is to adjust a current source with the output signal from a D/A converter. Such an adjustment is shown in FIG. 14B. As shown in FIG. 14B, registers 1402-1 through 1402-N are coupled to D/A converter 1403. As discussed above, registers 1402-1 through 1402-N hold a digitized parameter measured with a device test circuit according to the present invention. In some embodiments, registers 1402-1 through 1402-N can be loaded from a scan path serial data stream. As shown in FIG. 14B, the output signal from D/A converter 1403 is utilized to control transistor 1404 of current mirror 1405 so that the output signal is dependent on the output signal from D/A converter 1403.

Figure 14C:
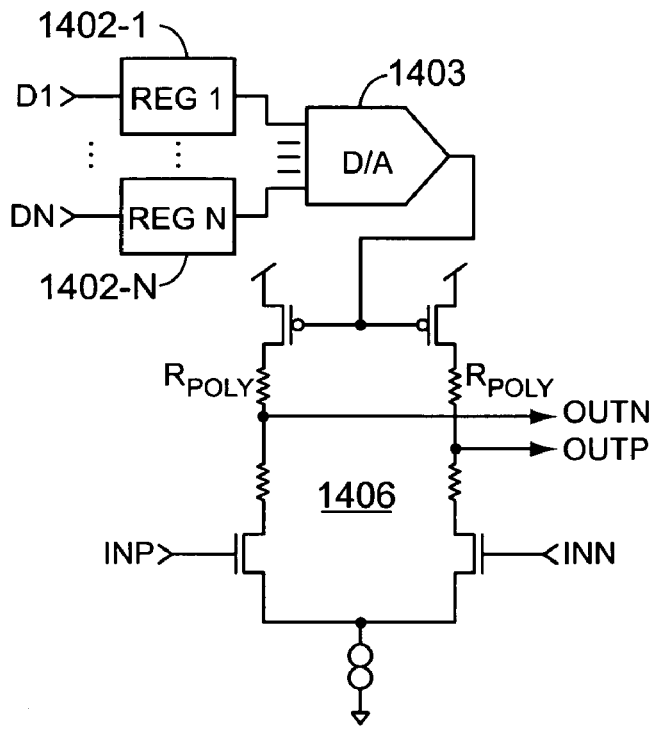
Figure 14D:
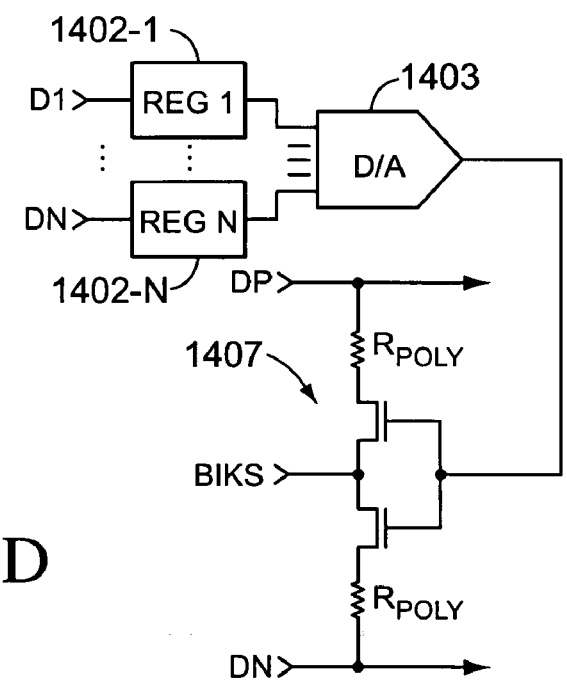

As shown in FIG. 14C, a third method includes adjusting the impedance of a polysilicon load circuit such as an output driver circuit 1406. The impedance of output driver circuit 1406 is modified by the impedance of the series resistors/transistors whose gates are driven by the output signal from D/A converter 1403. In a similar fashion, as shown in FIG. 14D, the input impedance of a receiver circuit 1407 is modified by transistors in series of the polysilicon resistors.

Figure 14E:
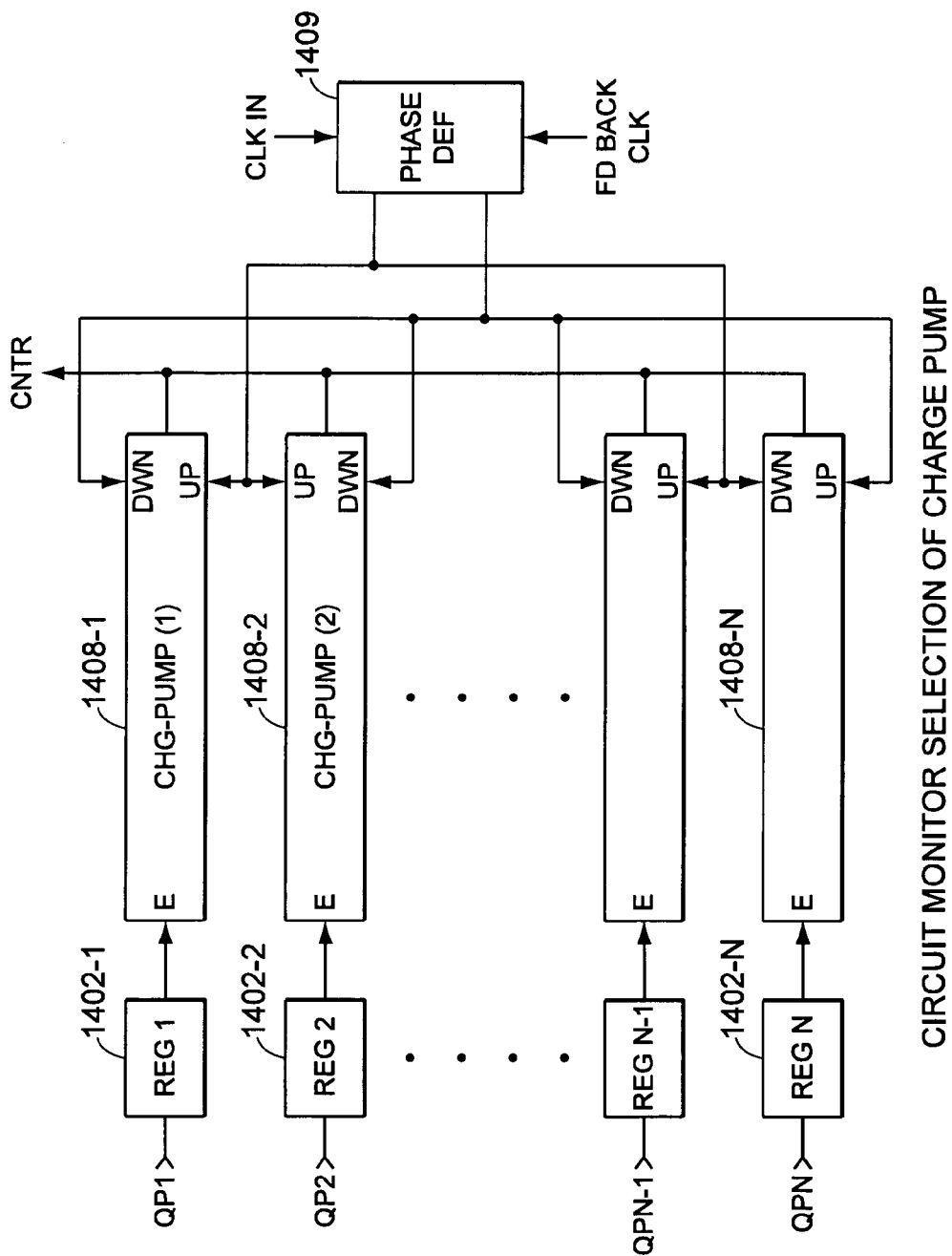

In some embodiments, the loop gain of a phase-lock-loop can be modified by the selection of an appropriate number of parallel charge pump current sources based on the data from the process, device, and circuit monitors of test circuits according to the present invention. Such a device is shown in FIG. 14E, where charge pumps 1408-1 through 1408-N are coupled to registers 1402-1 through 1402-N, respectively, and drive phase detector 1409.

Figure 15A:
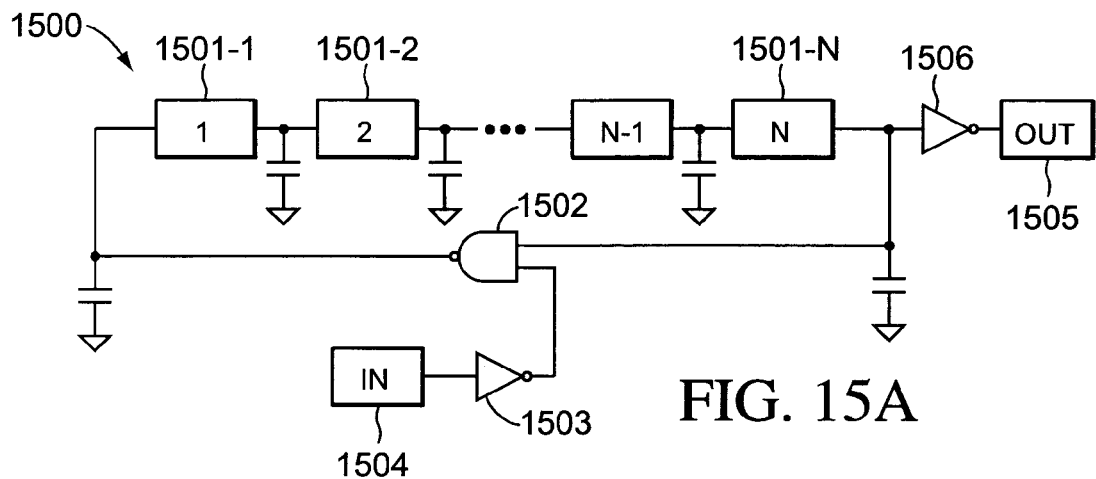
FIGS. 15A through 15D illustrate a ring delay circuit as a test circuit in a scan path technology.

FIGS. 15A through 15D illustrate stage delay test circuits according to some embodiments of the present invention. FIG. 15A illustrates a ring delay circuit 1500. In some embodiments, ring delay circuit 1500 can have an even number N of stages 1501-1 through 1501-N. A two input NAND gate 1502 completes the loop for an odd number of inverting stages. The input signal from an input register 1504 is coupled to NAND gate 1502 through an inverter 1503. The output signal is received at register 1505 through inverter 1506.

Figure 15B:
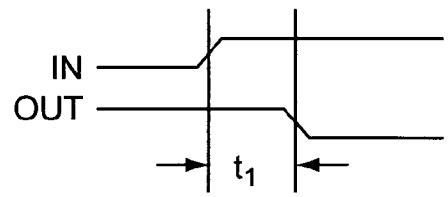
Figure 15C:
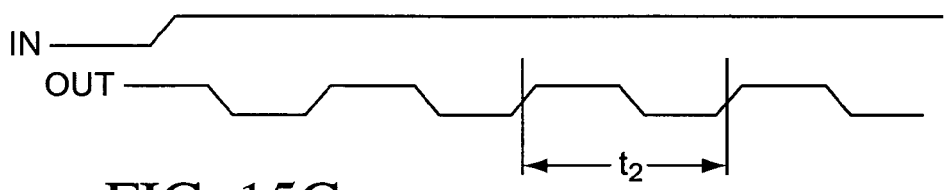

The time delay measurement of a string of inverting stages is shown in FIG. 1B. As shown in FIG. 15B, the time delay measurement can be made on a string of stages with output signals resting at either ground or power. As shown in FIG. 15C, the time delay measurement of the oscillating period can be made on ring delay circuit 1500 by skipping several clock cycles before measuring the time delay period t2.

Ring delay circuit 1500 can be incorporated in a scan path technology, which provides scan registers for the designated in register 1504 and out register 1505 shown in FIG. 15A. The external tester utilizing the scan path can provide a data and instruction stream for executing the test and can also sample the output data to determine the time delay and, from the time delay, analyze the performance of test ring delay circuit 1500.

Figure 15D:
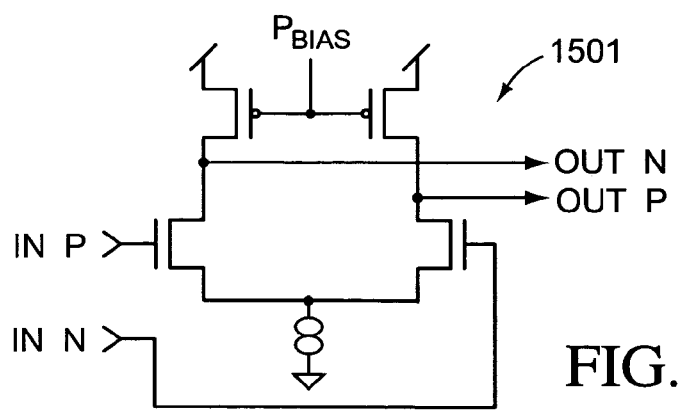

FIG. 15D illustrates an arbitrary one of delay stages 1501-1 through 1501-N. Delay measurements shown in FIGS. 15B and 15C can be obtained by utilizing delay stage 1501 as shown in FIG. 15A.

Figure 16A:
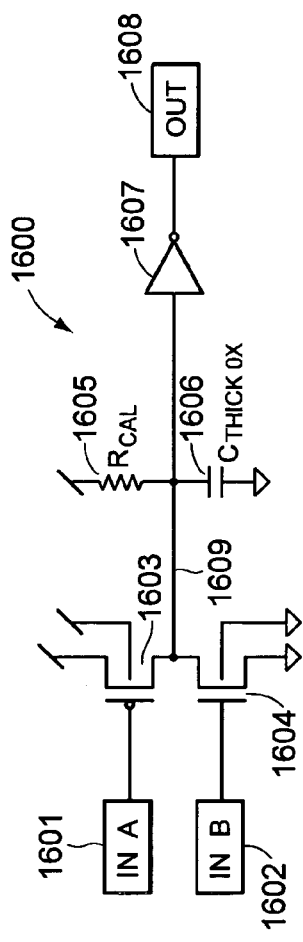
FIGS. 16A through 16I illustrate some further testing circuits with device thresholds and characteristics curves of source-drain current versus source-drain voltage as a function of gate voltage for P or N channel transistors.

FIGS. 16A through 16I illustrate several calibration circuits in a scan path technology according to embodiments of the present invention. FIG. 16A illustrates a resistor calibration circuit 1600 according to some embodiments of the present invention. Input A 1601 and input B 1602 are coupled to the gates of transistors 1603 and 1604, respectively. Transistors 1603 and 1604 are coupled serially between power and ground, defining a node 1609. Resistor 1605 and capacitor 1606 are coupled serially between power and ground through node 1609. Node 1609 is then coupled to driver 1607. Driver 1607 is coupled to output register 1608. Capacitor 1606 can be a thick oxide capacitor whose capacitance can be calculated. As has been discussed above, the resistance of resistor 1605 can then be determined by the charging and discharging times of capacitor 1606.

Figure 16B:
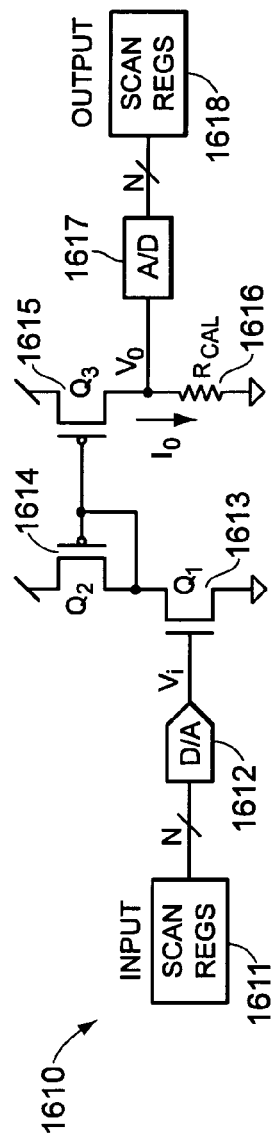
Figure 16C:
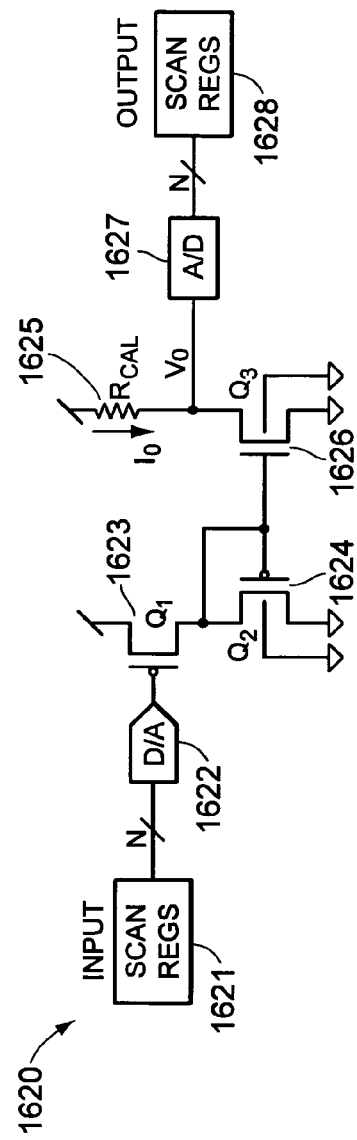
Figure 16G:
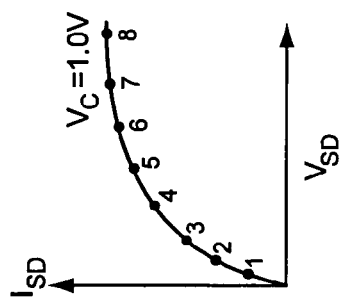

FIGS. 16B and 16C illustrate circuits 1610 and 1620, respectively, for measurement of transistor thresholds in a scan path technology. Circuit 1610 illustrated in FIG. 16B illustrates measurement of the characteristics of a P-channel transistor whereas circuit 1620 illustrated in FIG. 16C. The characteristics curve for a P-Channel transistor is shown in FIG. 16D whereas the characteristics curve for an N-channel transistor is shown in FIG. 16E.

As shown in FIG. 16B, a scan register 1611 is coupled to a digital-to-analog (D/A) converter 1612 to provide a voltage to the gate of transistor 1613. Transistor 1613 is coupled in series with transistor 1614 between power and ground. Transistor 1615 is coupled in series between power and ground with calibration resistor 1616. The gate of transistors 1614 and 1615 are both coupled to the node between transistor 1614 and transistor 1613. The node between transistor 1615 and resistor 1616 is input to an analog-to-digital (A/D) converter 1617, which provides data to an output scan register 1618.

As shown in circuit 1620 illustrated in FIG. 16C, input scan register 1621 is coupled to D/A converter 1622, which provides a voltage to the gate of transistor 1623. Transistor 1623 is coupled in series between power and ground with transistor 1624. A transistor 1626 is coupled between resistor 1625 and ground and resistor 1625 is coupled between transistor 1626 and power. The gates of transistors 1624 and 1626 is coupled to the node between transistors 1623 and 1624. The node between resistor 1625 and transistor 1626 is coupled to A/D converter 1627, which provides output data to a scan register 1628.

Input scan registers 1611 and 1621 can be loaded with data from a serial scan path. The output scan registers 1618 and 1628 sample the output data from A/D converters 1617 and 1627, respectively. In operation, the output voltage from A/D converters 1617 can be started at ground potential and the output voltage from AID converter 1627 can be started at power. The current through resistor 1615 increases from zero on the increase of voltage from D/A converter 1612 after the threshold voltage. Further, the current through resistor 1625 increases from zero with increase of the voltage from D/A converter 1622 after the threshold voltage. In circuits 1610 and 1620, the current can be determined by the measurement of the voltage by A/D converters 1617 and 1627, respectively, knowing the value of calibration resistors 1615 and 1625, respectively.

Figure 16F:
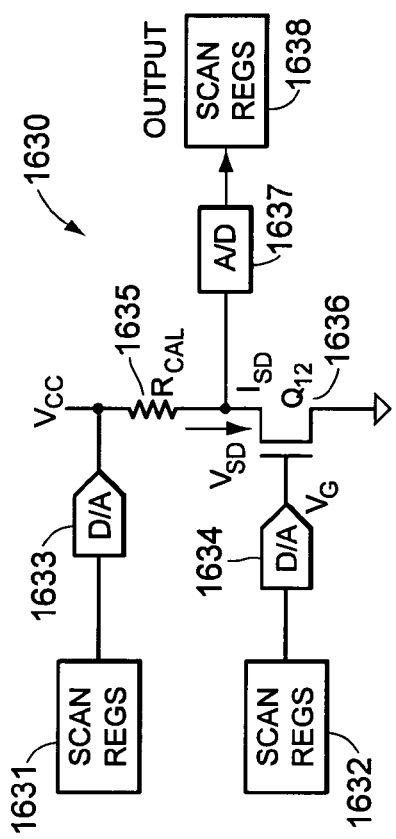
Figure 16D:
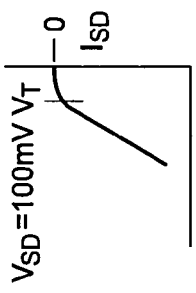
Figure 16I:
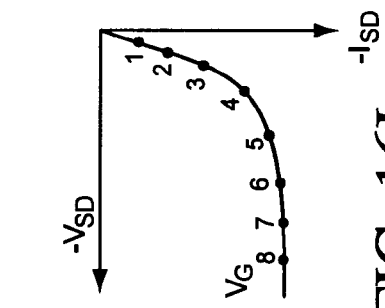
Figure 16H:
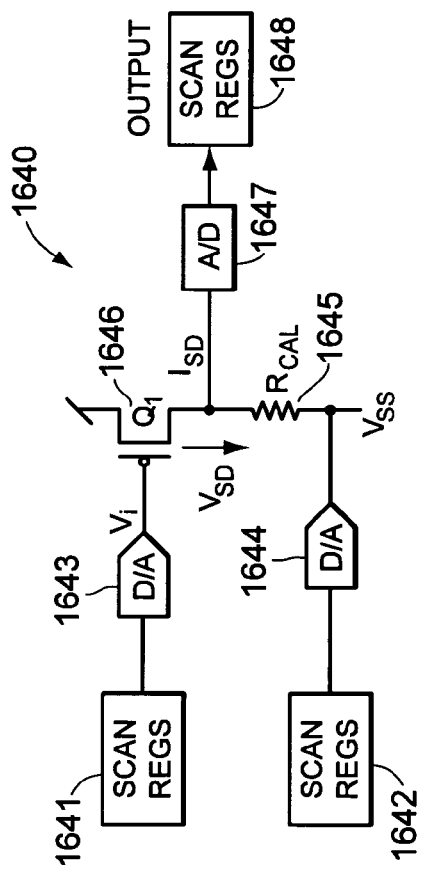
Figure 16E:
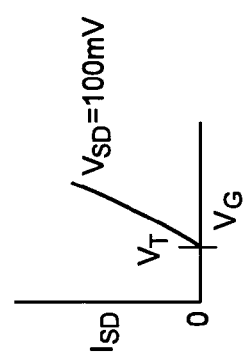

FIGS. 16F and 16H illustrate measurement of transistor characteristic curves. FIG. 16F illustrates circuit 1630 for measurement of N-channel characteristic curves. An example of such a characteristic curve, e.g. current versus voltage at various settings of gate voltage, is shown in FIG. 16G. FIG. 16H illustrates circuit 1640 for measurement of P-channel characteristic curves. An example of a P-channel characteristic curve is shown in FIG. 16I.

In circuit 1630 of FIG. 16F, a scan register 1632 is coupled to a D/A converter 1634 to provide a voltage to the gate of N-channel transistor 1636. Transistor 1636 is coupled serially with a calibration resistor 1635 between a voltage Vcc and ground. In some embodiments, the drain of transistor 1636 is connected to ground and resistor 1635 is connected to voltage Vcc. As shown in FIG. 16F, a scan register 1631 is coupled to a D/A converter 1633 in order to provide the voltage Vcc to resistor 1635. The node between resistor 1635 and transistor 1636 is coupled to an A/D converter 1637, which provides data to a scan register 1638. Therefore, the scan register 1638 samples the current through resistor 1635 and transistor 1636 by measuring the voltage at the node between resistor 1635 and transistor 1636.

In operation, the gate voltage of transistor 1636 can be set to a potential above the threshold voltage. The voltage Vcc is then set at a potential such that a voltage VSD is established at the node between resistor 1635 and transistor 1636 and is subsequently measured by A/D converter 1637 and the data transferred to scan register 1638. The current through transistor 1636 can be determined from the voltage VSD, knowing the resistance of calibration resistance 1635. A set of data points for gate voltages can be similarly acquired to show a graph such as that illustrated in FIG. 16G.

Circuit 1640 of FIG. 16H characterizes a P channel transistor. As shown in FIG. 16H, a scan register 1641 coupled to a D/A converter 1643 is utilized to set the gate voltage of a transistor 1646. Transistor 1646 is coupled between a power supply voltage and a terminal of a calibration transistor 1645. The voltage at the opposite terminal of calibration transistor 1645 is determined by scan register 1642 through a D/A converter 1644. The node between transistor 1646 and resistor 1645 is coupled to A/D converter 1647, which provides digitized data to an output scan register 1648. Circuit 1640 operates similarly to circuit 1630 of FIG. 16F in order to provide data similar to that illustrated in FIG. 16I.

Figure 17A:
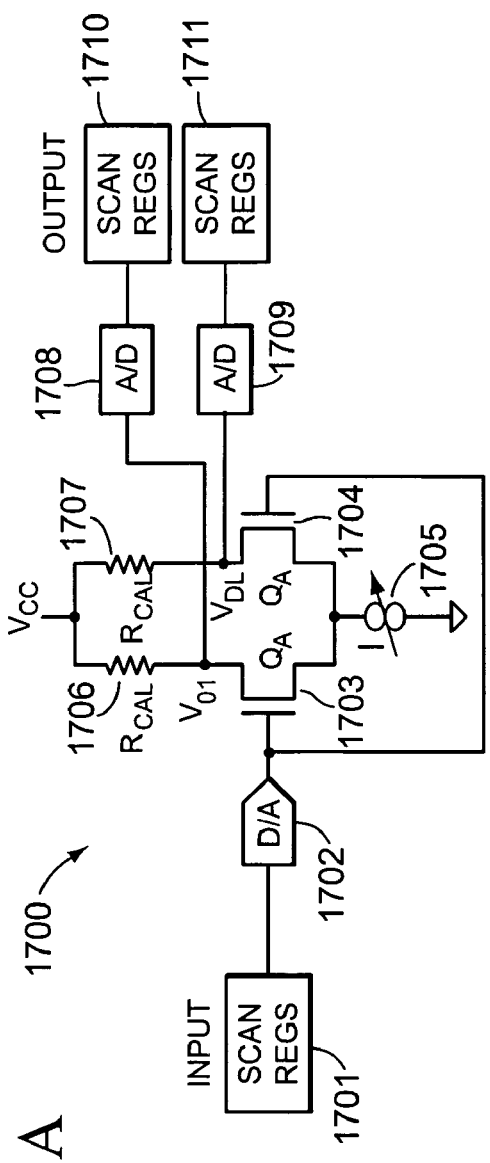
FIGS. 17A and 17B illustrate a feedback circuit according to the present invention for determining the offset voltage for P or N channel differential transistor pairs.
Figure 17B:
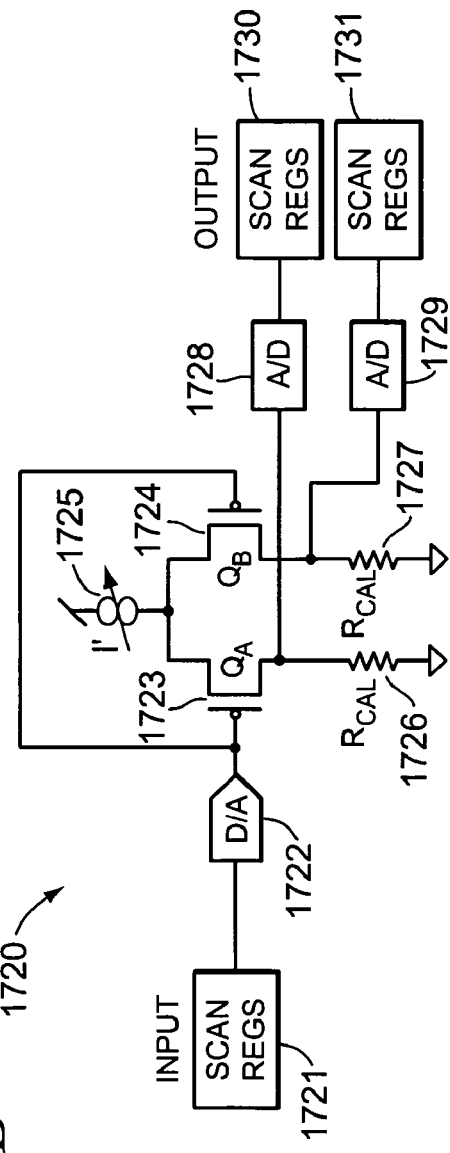

FIGS. 17A and 17B illustrate measurements of the characteristics of a differential pair. In particular, FIG. 17A illustrates a circuit 1700 for measurement of the input offset voltages in an N-channel differential pair. FIG. 17B illustrates a circuit 1720 for measurement of the input offset voltages in a P-channel differential pair. The values obtained for offset voltages in test circuits 1600 and 1620 can be utilized throughout the integrated circuit to set offset voltages for similar differential pair circuits.

In circuit 1700, shown in FIG. 17A, the differential circuit includes transistor 1703 and 1704 both coupled to a programmable current source 1705, which is coupled to ground. Transistor 1703 is coupled through calibration resistor 1706 to supply voltage Vcc. Transistor 1704 is coupled through calibration resistor 1707 to supply voltage Vcc. As shown in FIG. 17a, a scan register 1701 is coupled to D/A converter 1702 in order to supply the gate voltage to transistors 1703 and 1704. The node between transistor 1703 and calibration resistor 1706 is coupled to A/D converter 1708, which provides digitized data to scan register 1710. The node between transistor 1704 and calibration resistor 1707 is coupled to A/D converter 1709, which provides digitized data to scan register 1711.

In operation, the gate voltages of transistor 1703 and 1704 are set in scan register 1701. Further, current source 1705 is programmed to its operating settings. The differential pair's output voltage can then be determined by dividing the difference between the values in scan registers 1710 and 1711 by the gain of the differential stage, which is obtained by the product of gm and Rcal. The value gm is given by $I/(kT/q)$, where I is the current through current source 1705, k is Boltzman's constant, T is the temperature in Kelvin, and q is the electronic charge.

The similar circuit for measuring the offset voltages in a P-channel differential pair is shown in FIG. 17B. As shown in circuit 1720, the differential pair circuit includes P-channel transistors 1723 and 1725, each coupled to programmable current source 1725. Programmable current source 1725 is coupled to power Vcc. Transistor 1723 is further coupled through resistor 1726 to ground. Transistor 1724 is further coupled through resistor 1727 to ground. As shown in FIG. 17B, a scan register 1723 coupled to an D/A converter 1722 provides a voltage to the gates of transistors 1723 and 1724. Further, the node between transistor 1723 and calibration resistor 1726 is coupled to A/D converter 1728, which provides data to scan registers 1730. Further, the node between transistor 1724 and calibration resistor 1727 is coupled to A/D converter 1729, which provides data to scan register 1731. Circuit 1720 shown in FIG. 17B operates in the same fashion as does circuit 1700 shown in FIG. 17A. Again, current source 1725 is set at an operating level and the voltage at the gates of transistors 1723 and 1724 are set. The offset voltage is calculated as described above from the difference between the voltages stored in registers 1730 and 1731, divided by the gain of the differential stage.

The temperature of various points of interest on the chip can be obtained by comparing on-chip resistor and transistor parameter values with off-chip calibration device values. As is apparent, temperatures at various locations on an integrated circuit can be monitored by monitoring the resistance or the characteristics of a differential stage.

The tests described in this disclosure can be incorporated in miniature standard cell blocks allowing them to be placed in the integrated circuit itself, rather than in stand-alone test structures located in the scribe line area or in a registration die on the wafer. The standard cell test structure approach has several advantages over the conventional stand alone, large process monitors. As one advantage, the device under test may be small, thus providing measurement values that do not need to be scaled from a much larger device structure. As an example, gate oxide leakage measurements are typically performed with test devices covering several hundred square mils. The possibility of one sub-micron flawed site of gate oxide would skew the obtained data by orders of magnitude larger than would be typical for a single device.

As another advantage, because the test circuits are in the standard cell library, the devices placed on the integrated circuit are identical in channel dimensions (i.e. minimum channel widths) as other devices on the integrated circuit. This allows for the accounting of device parameters such as device threshold sensitivities to be accurate for the minimum dimensions.

Further, as another advantage, there is no possibility of damaging the device under test, as for example with probing of stand along structures. Further, the measurement performed on the device is performed in the same location and environment of surrounding circuits as other devices on the integrated circuit experience. For example, the physical condition of temperature is the same. Delay measurements take into account the value of the internal power supply, which is the same for both the test circuits and the devices on the integrated circuit itself.

As another advantage, the standard cell devices are designed with exactly the same design rule tolerances without a need to compromise the sizes, such as making them larger as is done with conventional test structures. The possibilities of a defect in the source drain tolerance, for example, of a large channel width transistor can distort the magnitude of the source drain leakage.

Another advantage is that the standard cell test structures are in each integrated circuit and can be readily accessed whether the circuit is in wafer or packaged form. Special probes or test setups are not required.

Another advantage is that all process, device, and circuit measurements can be made with an expansion of the standard cell circuits. This includes circuits and devices that are not yet fabricated with process parameters not yet considered critical.

Other adaptive circuit monitors based on more elegant monitors, such as eye-diagram monitors found on high speed SerDes (Serial-Deserial) interface circuits will be given more range and better resolution operating in conjunction with the process, device, and circuit monitors described herein. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A testing circuit embedded in an integrated circuit, comprising:
    an analog test circuit embedded within the integrated circuit configured to provide a test data output signal related to at least one analog process, device, or circuit parameter of the integrated circuit in response to an input test signal;
    an input register embedded within the integrated circuit that receives a digital input signal from a scan path circuit and provides the input test signal to the analog test circuit; and
    an output register embedded within the integrated circuit that receives the test data output signal from the analog test circuit and provides a digital output signal to the scan path circuit.

2. The testing circuit of claim 1, wherein the analog test circuit is a resistance testing circuit.

3. The testing circuit of claim 1, wherein the analog test circuit is a saturation current testing circuit.

4. The testing circuit of claim 1, wherein the analog test circuit is a leakage current testing circuit.

5. The testing circuit of claim 1, wherein the analog test circuit is a threshold voltage testing circuit.

6. The testing circuit of claim 1, wherein the analog test circuit is a delay line testing circuit.

7. The testing circuit of claim 2, wherein the analog test circuit determines a resistance value.

8. The testing circuit of claim 1, wherein the analog test circuit is a device monitoring circuit.

9. The testing circuit of claim 1, wherein the input register comprises a digital-to-analog converter.

10. The testing circuit of claim 1, wherein the output register comprises an analog-to-digital converter.

11. The testing circuit of claim 1, wherein the digital output signal provided by the output register is utilized to adjust operating parameters in the integrated circuit.

12. The testing circuit of claim 1, wherein the analog test circuit is one of a group of analog test circuits included in a standard cell library.

13. The testing circuit of claim 1, wherein the analog test circuit monitors the temperature on the integrated circuit.

14. A method of testing and monitoring an integrated circuit having an embedded testing circuit, the testing circuit including an input register, an output register, and an analog test circuit configured to provide a test data output signal related to at least one analog process, device, or circuit parameter of the integrated circuit in response to an input test signal, the method comprising:

placing the integrated circuit in a test controller in communication with the input and output registers of the testing circuit;

sending a digital input signal to the input register of the testing circuit using the test controller via a scan path circuit, the input register being coupled to provide a corresponding input test signal to the analog test circuit; and reading the a digital output signal from the output register of the testing circuit using the test controller via a scan path circuit, the output register being coupled to receive the test data output signal from the analog test circuit and provide a corresponding digital output signal to the scan path circuit.

15. The method of claim 14, wherein the analog test circuit conducts a leakage current test.

16. The method of claim 14, wherein the analog test circuit conducts a saturation current test.

17. The method of claim 14, wherein the analog test circuit conducts a threshold voltage test.

18. The method of claim 14, wherein the analog test circuit determines a resistor value.

19. The method of claim 14, further including adjusting at least one parameter in the integrated circuit based on the digital output signal read from the output register.

* * * * *